(12) United States Patent
Yoo et al.

(10) Patent No.: US 12,218,284 B2
(45) Date of Patent: Feb. 4, 2025

(54) LIGHT EMITTING ELEMENT, DISPLAY DEVICE USING THE SAME, AND METHOD OF FABRICATING DISPLAY DEVICE

(71) Applicant: Samsung Display Co., LTD., Yongin-si (KR)

(72) Inventors: Je Won Yoo, Yongin-si (KR); Se Young Kim, Yongin-si (KR); Joo Yeol Lee, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 331 days.

(21) Appl. No.: 17/241,465

(22) Filed: Apr. 27, 2021

(65) Prior Publication Data
US 2022/0045244 A1 Feb. 10, 2022

(30) Foreign Application Priority Data
Aug. 10, 2020 (KR) .................. 10-2020-0100135

(51) Int. Cl.
*H01L 33/44* (2010.01)
*H01L 27/15* (2006.01)
(Continued)

(52) U.S. Cl.
CPC ............ *H01L 33/44* (2013.01); *H01L 27/156* (2013.01); *H01L 33/0025* (2013.01);
(Continued)

(58) Field of Classification Search
CPC ... H01L 33/44; H01L 27/156; H01L 33/0025; H01L 33/0075; H01L 33/20; H01L 33/32;
(Continued)

(56) References Cited

U.S. PATENT DOCUMENTS

| | | | |
|---|---|---|---|
| 9,570,425 B2 | 2/2017 | Do | |
| 2003/0052328 A1* | 3/2003 | Uemura | .................. H01L 33/40 257/745 |

(Continued)

FOREIGN PATENT DOCUMENTS

| | | |
|---|---|---|
| KR | 10-1436123 | 11/2014 |
| KR | 10-2018-0033927 | 4/2018 |

(Continued)

OTHER PUBLICATIONS

International Search Report corresponding to International Application No. PCT/KR2021/009735 dated Nov. 5, 2021.

*Primary Examiner* — Su C Kim
(74) *Attorney, Agent, or Firm* — KILE PARK REED & HOUTTEMAN PLLC

(57) ABSTRACT

A light emitting device may include a first semiconductor layer; an active layer disposed on the first semiconductor layer; a second semiconductor layer disposed on the active layer; an electrode layer disposed on the second semiconductor layer; a protective layer disposed on the electrode layer; and an insulating film enclosing outer circumferential surfaces of at least the first semiconductor layer, the active layer, the second semiconductor layer, and the electrode layer, and exposing a surface of the first semiconductor layer and a surface of the protective layer.

12 Claims, 25 Drawing Sheets

(51) Int. Cl.
*H01L 33/00* (2010.01)
*H01L 33/20* (2010.01)
*H01L 33/32* (2010.01)

(52) U.S. Cl.
CPC .......... *H01L 33/0075* (2013.01); *H01L 33/20* (2013.01); *H01L 33/32* (2013.01); *H01L 2933/0025* (2013.01)

(58) Field of Classification Search
CPC ........... H01L 2933/0025; H01L 25/167; H01L 25/0753; H01L 2933/0016; H01L 33/38; H01L 21/76895; H01L 27/1214; H01L 29/786; H01L 33/52
See application file for complete search history.

(56) References Cited

U.S. PATENT DOCUMENTS

| | | | | |
|---|---|---|---|---|
| 2010/0171125 A1* | 7/2010 | Yoo | .......................... | H01L 33/44 |
| | | | | 257/E33.025 |
| 2014/0145237 A1* | 5/2014 | Do | .......................... | H01L 33/44 |
| | | | | 438/34 |
| 2017/0317228 A1* | 11/2017 | Sung | ........................ | H01L 33/24 |
| 2018/0175104 A1* | 6/2018 | Kang | ..................... | H01L 33/005 |
| 2021/0351171 A1 | 11/2021 | Yoo et al. | | |

FOREIGN PATENT DOCUMENTS

| | | |
|---|---|---|
| KR | 10-2020-0029100 | 3/2020 |
| KR | 10-2020-0034904 | 4/2020 |
| KR | 10-2020-0059377 | 5/2020 |
| KR | 10-2020-0077671 | 7/2020 |

* cited by examiner

FIG. 3I
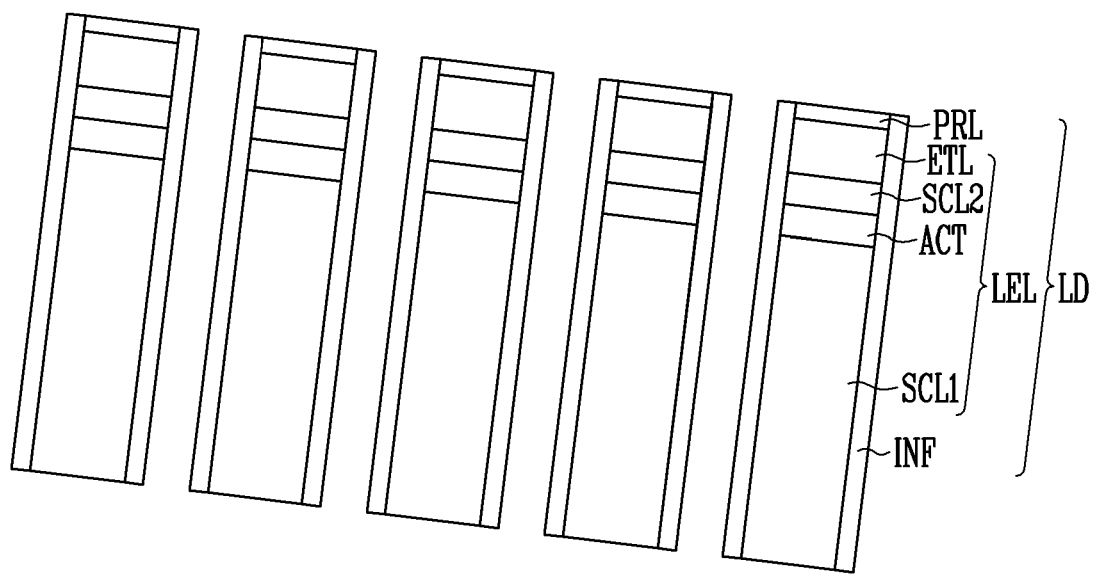
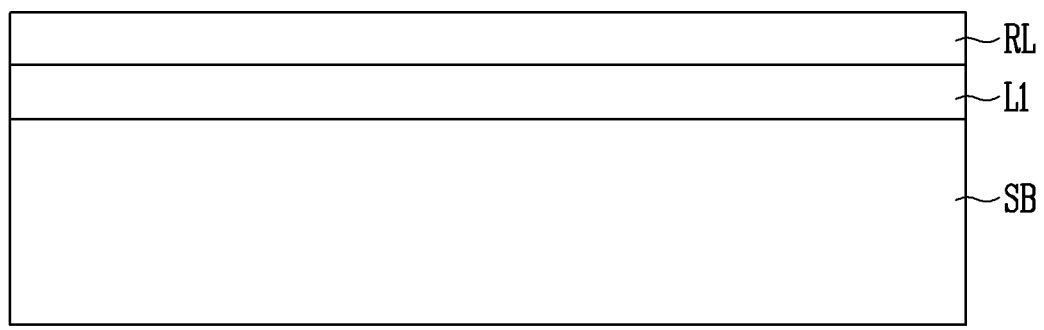

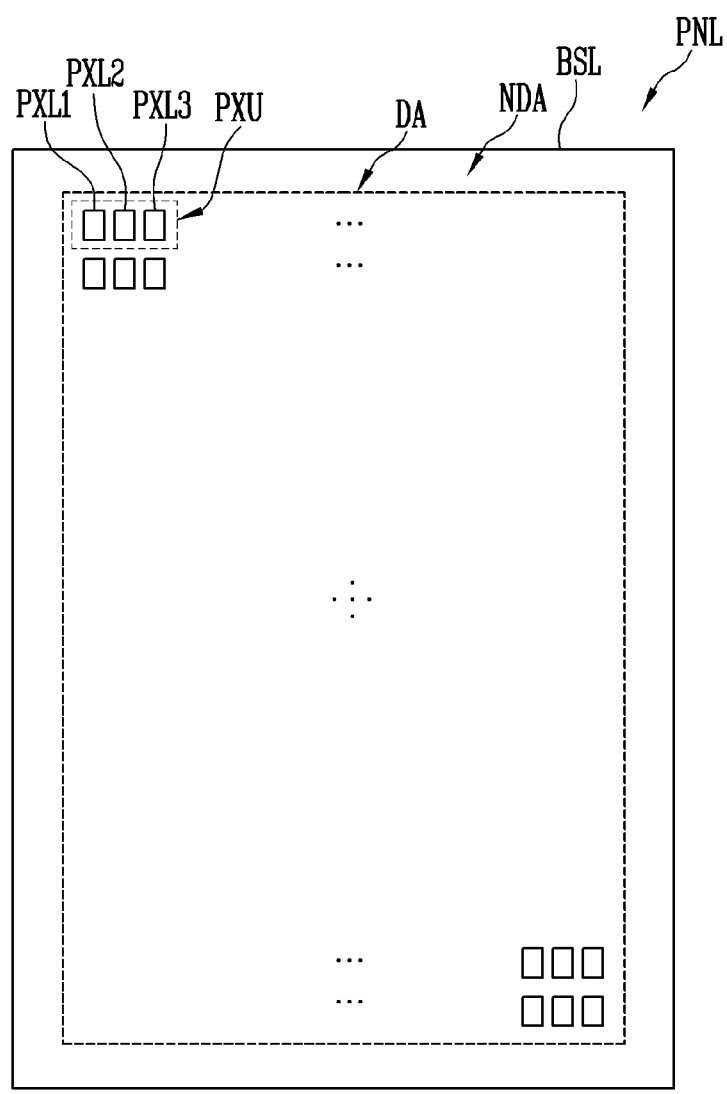

LIGHT EMITTING ELEMENT, DISPLAY DEVICE USING THE SAME, AND METHOD OF FABRICATING DISPLAY DEVICE

CROSS-REFERENCE TO RELATED APPLICATION

The application claims priority to and the benefit of Korean patent application number 10-2020-0100135 under 35 U.S.C. § 119, filed in the Korean Intellectual Property Office (KIPO) on Aug. 10, 2020, the entire contents of which are incorporated herein by reference.

BACKGROUND

1. Technical Field

Various embodiments of the disclosure relate to a light emitting element, a display device using the light emitting element, and a method of fabricating the display device.

2. Description of the Related Art

Recently, interest in information displays is increasingly growing. Hence, research and development on display devices have been continuously performed.

SUMMARY

Various embodiments of the disclosure are directed to a light emitting element including a protective layer, a display device using the light emitting element, and a method of fabricating the display device.

An embodiment of the disclosure may provide for a light emitting device including a first semiconductor layer; an active layer disposed on the first semiconductor layer; a second semiconductor layer disposed on the active layer; an electrode layer disposed on the second semiconductor layer; a protective layer disposed on the electrode layer; and an insulating film enclosing outer circumferential surfaces of at least the first semiconductor layer, the active layer, the second semiconductor layer, and the electrode layer, and exposing a surface of the first semiconductor layer and a surface of the protective layer.

In an embodiment, the protective layer may have a thickness equal to or less than a thickness of the insulating film.

In an embodiment, the protective layer may include an insulating material having an etch rate equal to or higher than an etch rate of an insulating material for forming the insulating film.

In an embodiment, the protective layer may include an organic photoresist material.

In an embodiment, the protective layer may include at least one of polyimide and polyacrylate.

In an embodiment, the first semiconductor layer may include an N-type semiconductor layer including an N-type dopant. The second semiconductor layer may include a P-type semiconductor layer including a P-type dopant.

An embodiment of the disclosure may provide for a display device including a pixel disposed in a display area. The pixel may include a first electrode, and a second electrode spaced apart from the first electrode; a light emitting element including a first end adjacent to the first electrode, and a second end adjacent to the second electrode, and comprising a light emitting stack including a first semiconductor layer, an active layer, a second semiconductor layer, and an electrode layer, the first semiconductor layer, the active layer, the second semiconductor layer, and the electrode layer being successively disposed in a direction from the second end to the first end of the light emitting element; an insulating pattern disposed on a part of the light emitting element and exposing the first and the second ends of the light emitting element; and a first contact electrode and a second contact electrode electrically connecting the first and the second ends of the light emitting element to the first electrode and the second electrode, respectively. The light emitting element may include an insulating film enclosing an outer circumferential surface of the light emitting stack and exposing a surface of the electrode layer and a surface of the first semiconductor layer respectively at the first and the second ends of the light emitting element. The insulating film may have an asymmetric structure such that an upper surface of the insulating film contacting the insulating pattern and a lower surface of the insulating film opposite to the upper surface have different lengths or widths.

In an embodiment, a lower surface of the insulating film may protrude outward from the electrode layer at the first end of the light emitting element.

In an embodiment, the lower surface of the insulating film may protrude outward from the electrode layer at the first end of the light emitting element by a length equal to or less than a thickness of the insulating film.

In an embodiment, the lower surface of the insulating film may have a length or width greater than a length or a width of the upper surface of the insulating film in a longitudinal direction of the light emitting stack that extends from the first end to the second end of the light emitting element.

In an embodiment, the first contact electrode may directly contact a surface of the electrode layer on the first end of the light emitting element. The second contact electrode may directly contact a surface of the first semiconductor layer on the second end of the light emitting element.

An embodiment of the disclosure may provide for a method of fabricating a display device, including preparing a light emitting element including a first end and a second end and comprising a first semiconductor layer, an active layer, a second semiconductor layer, an electrode layer, a protective layer, the first semiconductor layer, the active layer, the second semiconductor layer, the electrode layer, and the protective layer being successively disposed in a direction from the second end to the first end, and an insulating film enclosing outer circumferential surfaces of the first semiconductor layer, the active layer, the second semiconductor layer, and the electrode layer and exposing a surface of the first semiconductor layer and a surface of the protective layer; forming a first electrode and a second electrode on a surface of a base layer; supplying the light emitting element onto the surface of the base layer and aligning the light emitting element between the first and the second electrodes; forming an insulating layer on the surface of the base layer; forming an insulating pattern on a part of the light emitting element by etching the insulating layer, the insulating pattern exposing the first and the second ends of the light emitting element; and electrically connecting the first and the second ends of the light emitting element to the first electrode and the second electrode, respectively. The forming of the insulating pattern may include removing the protective layer such that the electrode layer is exposed at the first end of the light emitting element.

In an embodiment, the preparing of the light emitting element may include: forming a light emitting stack by successively forming the first semiconductor layer, the active layer, the second semiconductor layer, and the electrode layer on a substrate; forming a rod-type light emitting stack by etching the light emitting stack in a longitudinal direction of the light emitting element; forming the protective layer on the rod-type light emitting stack; forming the insulating film on surfaces of the rod-type light emitting stack and the protective layer; etching the insulating film such that the protective layer is exposed; and separating the light emitting element from the substrate.

In an embodiment, the etching of the insulating film may include etching the protective layer by a partial thickness such that the protective layer has a thickness equal to or less than a thickness of the insulating film.

In an embodiment, the forming of the protective layer may comprise forming the protective layer by using an insulating material having an etch rate equal to or greater than an etch rate of an insulating material for forming the insulating film.

In an embodiment, the forming of the insulating film may comprise forming the insulating film by an atomic layer deposition process. The forming of the protective layer may comprise forming the protective layer by using a material that is not deformed at temperatures of the atomic layer deposition process.

In an embodiment, the forming of the protective layer may include applying an organic photoresist material onto a surface of the substrate on which the rod-type light emitting stack is formed; and forming the protective layer by patterning the organic photoresist material by a photo process using a mask.

In an embodiment, the electrically connecting of the first and the second ends of the light emitting element to the first electrode and the second electrode, respectively, may include forming a first contact electrode on the first end of the light emitting element and the first electrode, and forming a second contact electrode on the second end of the light emitting element and the second electrode.

BRIEF DESCRIPTION OF THE DRAWINGS

An additional appreciation according to the embodiments of the disclosure will become more apparent by describing in detail the embodiments thereof with reference to the accompanying drawings, wherein:

FIGS. 3A to 3I are schematic cross-sectional views sequentially illustrating a method of fabricating a light emitting element in accordance with an embodiment of the disclosure.

FIG. 4 is a schematic plan view illustrating a display device in accordance with an embodiment of the disclosure.

DETAILED DESCRIPTION OF THE EMBODIMENTS

Figure 1:
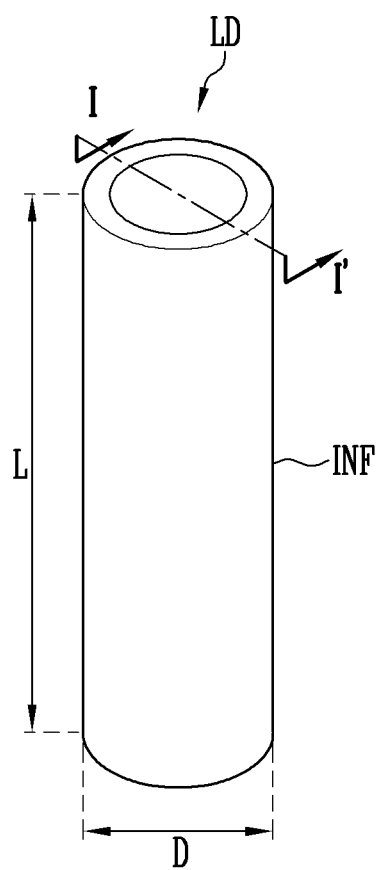
FIG. 1 is a schematic perspective view illustrating a light emitting element in accordance with an embodiment of the disclosure.

Reference will now be made in detail to various embodiments of the disclosure, specific examples of which are illustrated in the accompanying drawings and described below, since the embodiments of the disclosure can be variously modified in many different forms. Furthermore, a singular form may include a plural from as long as it is not specifically mentioned in a sentence.

However, the disclosure is not limited to the following embodiments and may be modified into various forms. Each embodiment to be described below may be implemented alone or combined with at least another embodiment to make various combinations of embodiments.

Some elements which are not directly related to the features of the disclosure in the drawings may be omitted to clearly explain the disclosure. Furthermore, the sizes, ratios, etc. of some elements in the drawings may be slightly exaggerated. It should be noted that the same reference numerals are used to designate the same or similar elements throughout the drawings, and repetitive explanation will be omitted.

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly defined herein.

In the specification and the claims, the phrase "at least one of" is intended to include the meaning of "at least one selected from the group of" for the purpose of its meaning and interpretation. For example, "at least one of A and B" may be understood to mean "A, B, or A and B."

FIG. 1 is a schematic perspective view illustrating a light emitting element LD in accordance with an embodiment.

Figure 2A:
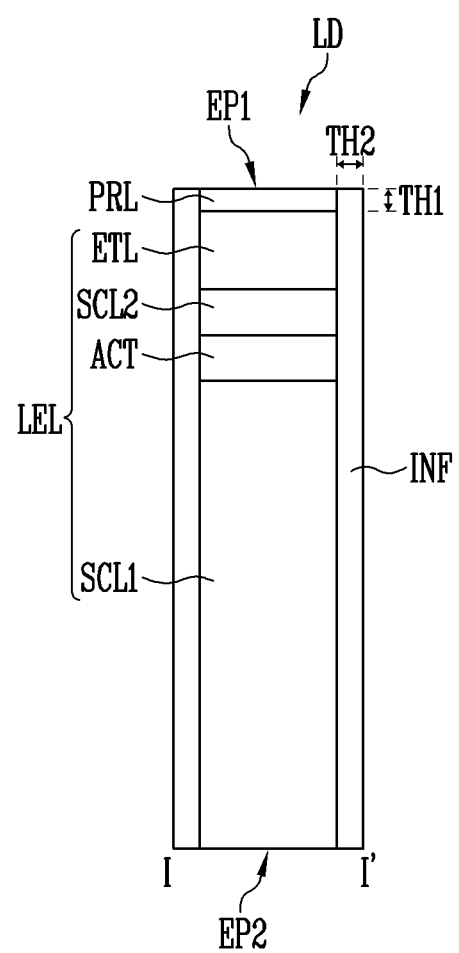
FIGS. 2A and 2B each are a schematic cross-sectional view illustrating a light emitting element in accordance with an embodiment of the disclosure.
Figure 2B:
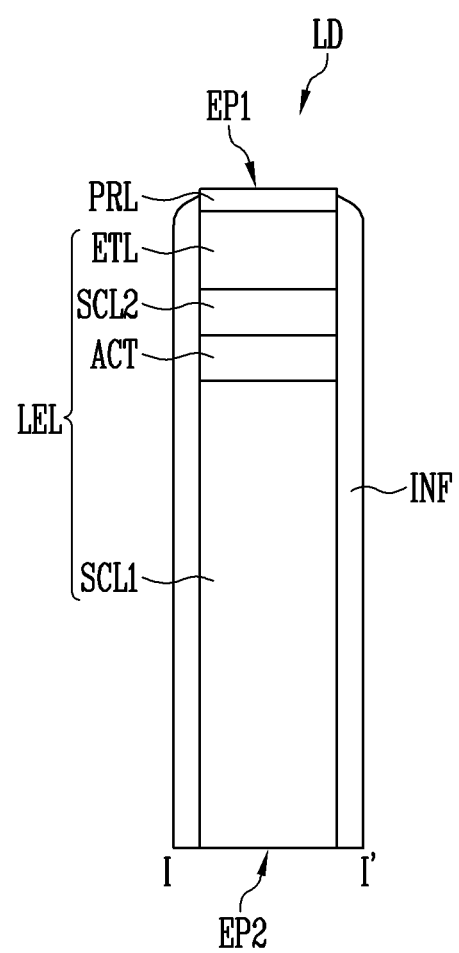

FIGS. 2A and 2B are schematic cross-sectional views illustrating a light emitting element LD in accordance with an embodiment. For example, FIGS. 2A and 2B illustrate different embodiments of a cross-section of the light emitting element LD that is taken along line I-I' of FIG. 1. The shape of an insulating film INF according to the embodiment of FIG. 2B is partially different from that of the embodiment of FIG. 2A.

Referring to FIGS. 1, 2A, and 2B, the light emitting element LD may include a light emitting stack LEL including a first semiconductor layer SCL1, an active layer ACT, a second semiconductor layer SCL2, and an electrode layer ETL which are successively or sequentially disposed in a direction, and a protective layer PRL disposed on the light emitting stack LEL such that the protective layer PRL is disposed on the electrode layer ETL. Furthermore, the light emitting element LD may include an insulating film INF configured to enclose the light emitting stack LEL and/or an outer circumferential surface (e.g., a sidewall) of the protective layer PRL. For example, the insulating film INF may enclose an outer circumferential surface of at least the light emitting stack LEL and selectively enclose the outer circumferential surface of the protective layer PRL.

In an embodiment, the light emitting element LD may be provided in a rod shape extending in a direction and have a first end EP1 and a second end EP2 on opposite ends thereof in a longitudinal direction (or a thickness-wise direction). The first end EP1 may be a first base side (or an upper surface) of the light emitting element LD. The second end EP2 may be a second base side (or a lower surface) of the light emitting element LD.

In the description of an embodiment, the term "rod shape" embraces a rod-like shape and a bar-like shape such as a cylindrical or prismatic shape extending in a longitudinal direction (for example, having an aspect ratio greater than 1), and the cross-sectional shape thereof is not limited to a particular shape. For example, the length L of the light emitting element LD may be greater than a diameter D thereof (or a width of the cross-section thereof).

The first semiconductor layer SCL1, the active layer ACT, the second semiconductor layer SCL2, the electrode layer ETL, and the protective layer PRL may be arranged successively in a direction from the second end EP2 to the first end EP1 of the light emitting element LD. In other words, the first semiconductor layer SCL1 may be disposed on the second end EP2 of the light emitting element LD, and the protective layer PRL may be disposed on the first end EP1 of the light emitting element LD.

The first semiconductor layer SCL1 may be a first conductive semiconductor layer. For example, the first semiconductor layer SCL1 may be an N-type semiconductor layer including an N-type dopant. For instance, the first semiconductor layer SCL1 may include an N-type semiconductor layer which includes a semiconductor material of InAlGaN, GaN, AlGaN, InGaN, AlN, and InN and is doped with a dopant such as Si, Ge, or Sn. However, the material for forming the first semiconductor layer SCL1 is not limited thereto, and the first semiconductor layer SCL1 may be formed of various other materials.

The active layer ACT may be disposed on the first semiconductor layer SCL1 and have a single- or multi-quantum well structure. The location of the active layer ACT may be changed in various ways depending on the type of the light emitting element LD. The active layer ACT may emit light having a wavelength ranging from about 400 nm to about 900 nm and have a double hetero structure.

A cladding layer (not shown) doped with a conductive dopant may be selectively formed on and/or under the active layer ACT. For example, the cladding layer may be formed of an AlGaN layer or an InAlGaN layer. In an embodiment, a material such as AlGaN or AlInGaN may be used to form the active layer ACT, and various other materials may be used to form the active layer ACT.

If a voltage equal to or greater than a threshold voltage is applied to the opposite ends of the light emitting element LD, the light emitting element LD may emit light by coupling of electron-hole pairs in the active layer ACT. Since light emission of the light emitting element LD can be controlled based on the foregoing principle, the light emitting element LD may be used as a light source of various light emitting devices as well as a pixel of a display device.

The second semiconductor layer SCL2 may be disposed on the active layer ACT and include a second conductive semiconductor layer different from that of the first semiconductor layer SCL1. For example, the second semiconductor layer SCL2 may include a P-type semiconductor layer including a P-type dopant. For instance, the second semiconductor layer SCL2 may include a P-type semiconductor layer which includes at least one semiconductor material of InAlGaN, GaN, AlGaN, InGaN, AlN, and InN, and is doped with a dopant such as Mg. However, the material for forming the second semiconductor layer SCL2 is not limited thereto, and the second semiconductor layer SCL2 may be formed of various other materials.

In an embodiment, the first semiconductor layer SCL1 and the second semiconductor layer SCL2 may have different lengths (or thicknesses) in the longitudinal direction (L) of the light emitting element LD. For example, the first semiconductor layer SCL1 may have a length (or a thickness) greater than that of the second semiconductor layer SCL2 in the longitudinal direction (L) of the light emitting element LD. Therefore, the active layer ACT of the light emitting element LD may be disposed closer to the first end EP1 than to the second end EP2.

The electrode layer ETL may be disposed on the second semiconductor layer SCL2. The electrode layer ETL may protect the second semiconductor layer SCL2 and be a contact electrode for effectively connecting (or coupling) the second semiconductor layer SCL2 to a predetermined electrode, line, or the like. For example, the electrode layer ETL may be an Ohmic contact electrode or a Schottky contact electrode.

The electrode layer ETL may be substantially transparent or translucent. Therefore, light generated from the light emitting element LD may be emitted from the light emitting element LD after passing through the electrode layer ETL. In an embodiment, in the case where light generated from the light emitting element LD is emitted from the light emitting element LD through an area thereof other than the end of the light emitting element LD on which the electrode layer ETL is disposed rather than passing through the electrode layer ETL, the electrode layer ETL may include opaque metal.

In an embodiment, the electrode layer ETL may include metal or metal oxide. For example, the electrode layer ETL may be formed using Cr, Ti, Al, Au, Ni, ITO, IZO, ITZO, and an oxide or alloy thereof alone or in combination with each other.

The protective layer PRL may be disposed on the electrode layer ETL, and a surface thereof (e.g., an upper surface thereof) may be exposed on the first end EP1 of the light emitting element LD. The protective layer PRL may include organic insulating material having a desired etch rate (etch selectivity). For example, the protective layer PRL may include organic photoresist material, e.g., at least one of polyimide and polyacrylate.

In an embodiment, the protective layer PRL may have a thickness TH1 equal to or less than a thickness TH2 of the insulating film INF and/or include insulating material having an etch rate equal to or greater than that of insulating material for forming the insulating film INF. Therefore, during a process of connecting (or coupling) the opposite ends of the light emitting element LD to predetermined electrodes and/or lines to drive the light emitting element LD, the protective layer PRL may be readily removed.

The insulating film INF may enclose at least outer circumferential surfaces (e.g., sidewalls) of at least the first semiconductor layer SCL1, the active layer ACT, the second semiconductor layer SCL2, and the electrode layer ETL and may expose a surface of each of the first semiconductor layer SCL1 and the protective layer PRL. Furthermore, the insulating film INF may or may not enclose the outer circumferential surface of the protective layer PRL. For example, the insulating film INF may enclose a portion of the sidewall of the protective layer PRL.

In an embodiment, as illustrated in FIG. 2A, the insulating film INF may enclose the entire sidewall of the protective layer PRL other than the surface (e.g., the upper surface) of the protective layer PRL that is disposed on the first end EP1. In this case, the insulating film INF may enclose the outer circumferential surface of the light emitting stack LEL to a height at which the protective layer PRL is formed. In an embodiment, as illustrated in FIG. 2B, the insulating film INF may enclose a portion of the sidewall of the protective layer PRL and expose an upper area of the sidewall of the protective layer PRL and the upper surface of the protective layer PRL.

As illustrated in FIG. 2A, the insulating film INF may have a substantially planar surface on the upper surface thereof (e.g., on the first end EP1 of the light emitting element LD) and may have an inclination on the upper surface thereof, as illustrated in FIG. 2B.

The insulating film INF may expose the protective layer PRL and the first semiconductor layer SCL1, respectively, on the first and second ends EP1 and EP2 of the light emitting element LD.

If the insulating film INF is provided to cover or overlap the surface of the light emitting element LD, particularly, the outer circumferential surfaces of the first semiconductor layer SCL1, the active layer ACT, the second semiconductor layer SCL2, and/or the electrode layer ETL, a short-circuit defect may be prevented from occurring from the light emitting element LD. Therefore, the electrical stability of the light emitting element LD may be secured.

If the insulating film INF is provided on the surface of the light emitting element LD, occurrence of a defect on the surface of the light emitting element LD may be reduced or minimized, whereby the lifetime and efficiency of the light emitting element LD may be improved. If the insulating film INF is formed on each light emitting element LD, in case that light emitting elements LD are adjacent to each other, the light emitting elements LD may be prevented from undesirably short-circuiting.

In an embodiment, a surface treatment process may be performed to fabricate the light emitting element LD. For example, each light emitting element LD may be surface-treated so that, in case that light emitting elements LD are mixed with a fluidic solution (or solvent) and then supplied to each emission area (e.g., an emission area of each pixel), the light emitting elements LD may be evenly dispersed rather than unevenly aggregating in the solution. In an embodiment, the insulating film INF itself may be formed of a hydrophobic film using hydrophobic material, or an additional hydrophobic film formed of hydrophobic material may be formed on the insulating film INF.

The insulating film INF may include transparent insulating material. Therefore, light generated from the light emitting stack LEL may be emitted from the light emitting element LD after passing through the insulating film INF.

For example, the insulating film INF may include at least one insulating material among silicon oxide ($SiO_x$) (e.g., $SiO_2$), silicon nitride ($SiN_x$) (e.g., $Si_3N_4$), aluminum oxide ($Al_xO_y$) (e.g., $Al_2O_3$), and titanium oxide ($Ti_xO_y$) (e.g., $TiO_2$), but the disclosure is not limited thereto. In other words, the material that forms the insulating film INF is not limited to a particular material, and the insulating film INF may include various insulating materials.

In an embodiment, the light emitting element LD may have a small size to a degree of the nanoscale to the microscale. For example, each light emitting element LD may have a diameter D (or a width) and/or a length L to a degree of the nanoscale to the microscale. However, in an embodiment, the size of the light emitting element LD is not limited thereto. For example, the size of the light emitting element LD may be changed in various ways depending on design conditions of various devices which employs, as a light source, a light emitting device using a light emitting element LD.

A light emitting device including the light emitting element LD may be used in various devices including a display device which requires a light source. For instance, light emitting elements LD may be disposed in each pixel of a display panel, so that the light emitting elements LD may be used as a light source of the pixel. However, the application of the light emitting element LD is not limited to the above-mentioned examples. For example, the light emitting element LD may be used in various devices such as a lighting device which requires a light source.

FIGS. 3A to 3I are schematic cross-sectional views sequentially illustrating a method of fabricating a light emitting element LD in accordance with an embodiment.

Figure 3A:
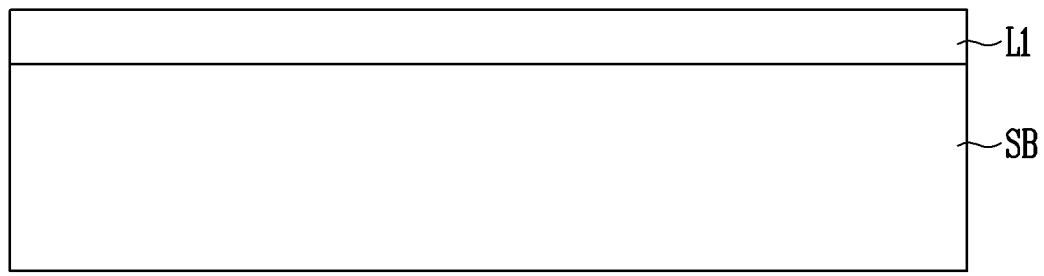

Referring to FIG. 3A, a substrate SB may be first prepared. A sacrificial layer L1 may be formed on the substrate SB.

The substrate SB may be a GaAs, GaP, or InP substrate. The substrate SB may be a wafer for epitaxial growth. The substrate SB may include, on a surface thereof, a ZnO substrate having a GaAs layer. Furthermore, a Ge substrate having a GaAs layer on a surface thereof and an Si substrate having a GaAs layer on an Si wafer with a buffer layer interposed between the GaAs layer and the Si wafer may also be used.

A single crystal substrate, which is fabricated by a known fabricating method or is an article on the market, may be used as the substrate SB. In the case where a selectivity for fabricating the light emitting element LD is satisfied and the epitaxial growth can be smoothly performed, the material of the substrate SB is not limited thereto. In the following embodiment, the substrate SB will be described as being a GaAs substrate formed of GaAs. Here, GaAs may be material, the wavelength of which varies depending on the temperature.

The substrate SB and the sacrificial layer L1 may contact each other. The sacrificial layer L1 may be disposed between the light emitting element LD and the substrate SB during a process of fabricating the light emitting element LD so that the light emitting element LD can be physically spaced apart from the substrate SB. The sacrificial layer L1 may be eventually separated from the light emitting element LD during the process of fabricating the light emitting element LD.

In an embodiment, the sacrificial layer L1 may be formed of GaAs, AlAs, or AlGaAs, but the disclosure is not limited thereto. In an embodiment, the sacrificial layer L1 may be omitted.

Figure 3B:
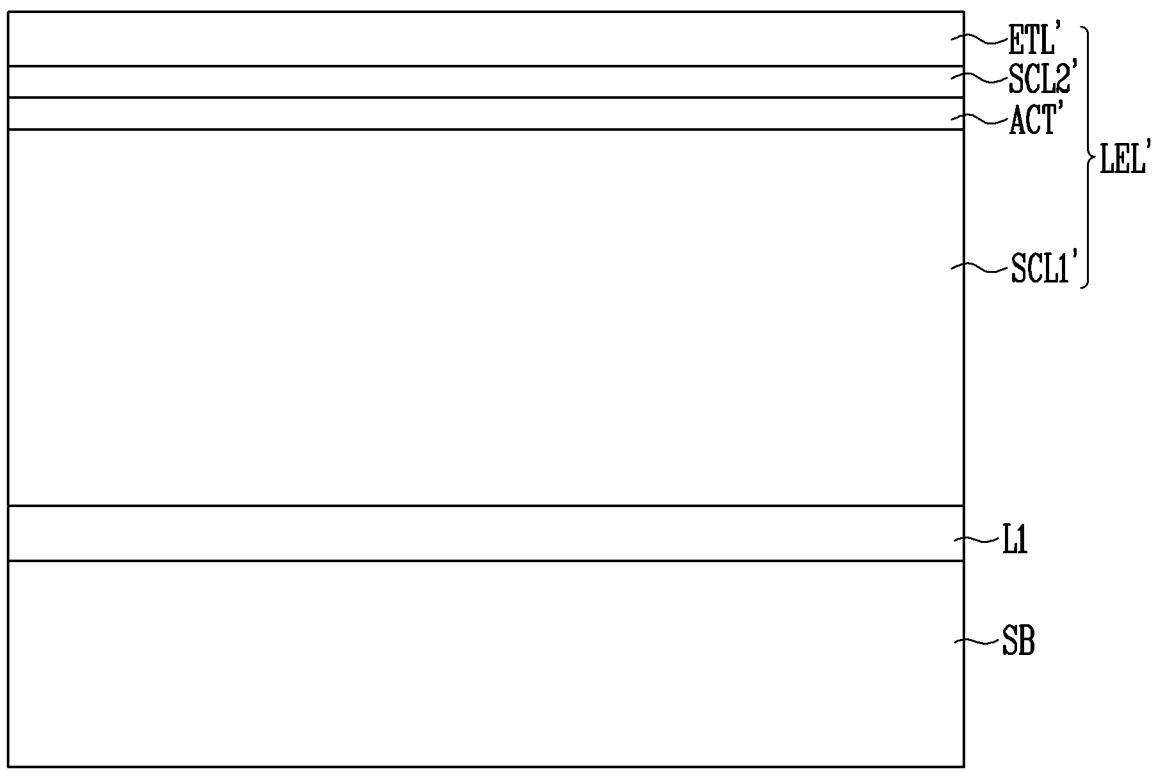

Referring to FIG. 3B, a first semiconductor layer SCL1, an active layer ACT, a second semiconductor layer SCL2, and an electrode layer ETV may be successively or sequentially formed on the substrate SB on which the sacrificial layer L1 is selectively formed. Therefore, a light emitting stack LEL' may be primarily formed.

The first semiconductor layer SCL1' may be formed on the sacrificial layer L1. The first semiconductor layer SCL1' may be formed by an epitaxial growth process in the same manner as that of the sacrificial layer L1 and may be formed by an MOCVD method, an MBE method, a VPE method, an LPE method, or the like. An additional semiconductor layer such as a buffer layer or an undoped semiconductor layer for enhancing crystallizability may be further formed between the first semiconductor layer SCL1' and the sacrificial layer L1. The first semiconductor layer SCL1' may include semiconductor material formed of group III (Ga, Al, In)-V(P, As) and include a semiconductor layer doped with a first conductive dopant such as Si, Ge, and Sn.

The active layer ACT' may be formed on the first semiconductor layer SCL1'. The active layer ACT' may be an area in which electrons and holes are re-coupled with each other and may make a transition to a lower energy level by the re-coupling of the electrons and the holes, thereby emitting light having a wavelength corresponding to the transition. The active layer ACT' may have a single- or multi-quantum well structure and include at least one material among GaInP, AlGaInP, GaAs, AlGaAs, InGaAs, InGaAsP, InP, and InAs, but the disclosure is not limited thereto.

The second semiconductor layer SCL2' may be formed on the active layer ACT'. The second semiconductor layer SCL2' may include a semiconductor layer having a type different from that of the first semiconductor layer SCL1'. The second semiconductor layer SCL2' may include semiconductor material formed of group III (Ga, Al, In)-V(P, As) and include a semiconductor layer doped with a second conductive dopant such as Mg.

The electrode layer ETL' may be formed on the second semiconductor layer SCL2'. The electrode layer ETL' may include metal or metal oxide. In an embodiment, the electrode layer ETL' may be formed of transparent metal oxide so as ITO to reduce or minimize loss of light to be emitted from the light emitting element LD and to enhance the effect of spreading current to the second layer SCL2 in the light emitting element LD.

Figure 3C:
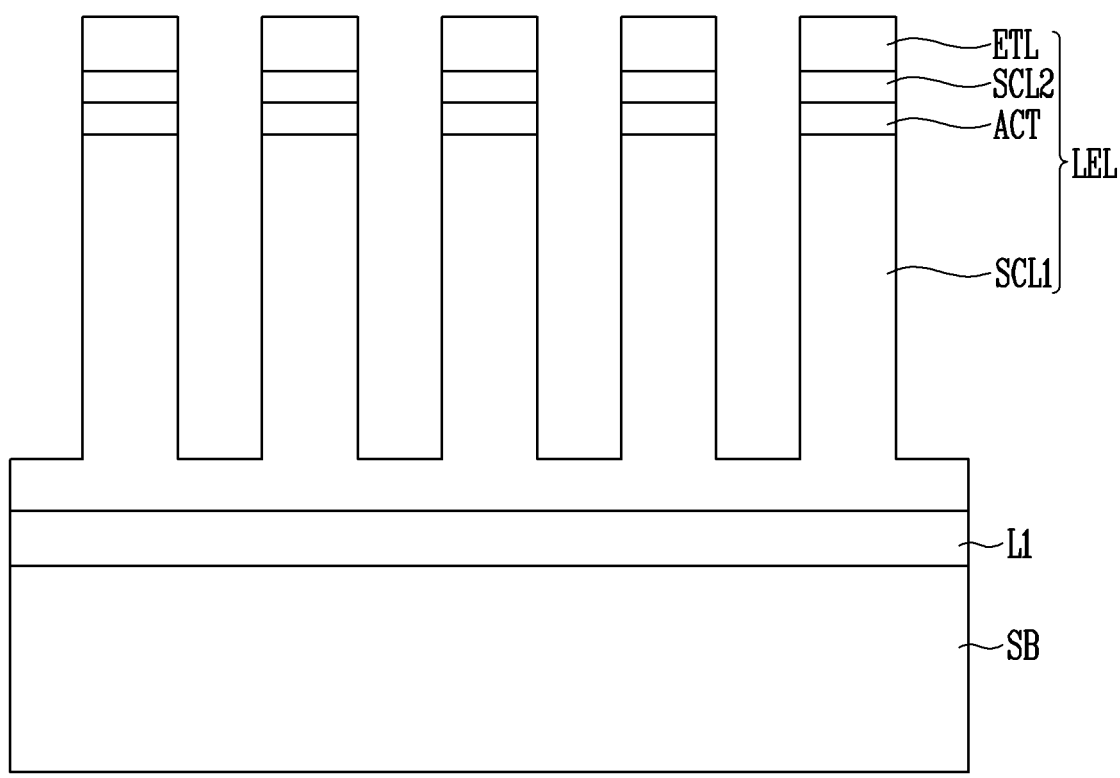

Referring to FIG. 3C, a rod-type light emitting stack LEL may be formed by etching the light emitting stack LEL' in a vertical direction. For example, each rod-type light emitting stack LEL may be formed by disposing a mask (not illustrated) on an upper surface of the light emitting stack LEL' that is primarily formed on the substrate SB and then patterning the light emitting stack LEL' in the vertical direction. In some embodiments, the rod-type light emitting stack LEL may be formed by etching the light emitting stack LEL' by the entire thickness thereof or by a partial thickness thereof.

In an embodiment, the light emitting stack LEL' may be patterned at a nanoscale or microscale interval and/or size. Therefore, rod-type light emitting stacks LEL each having a nanoscale or microscale size may be formed.

Figure 3D:
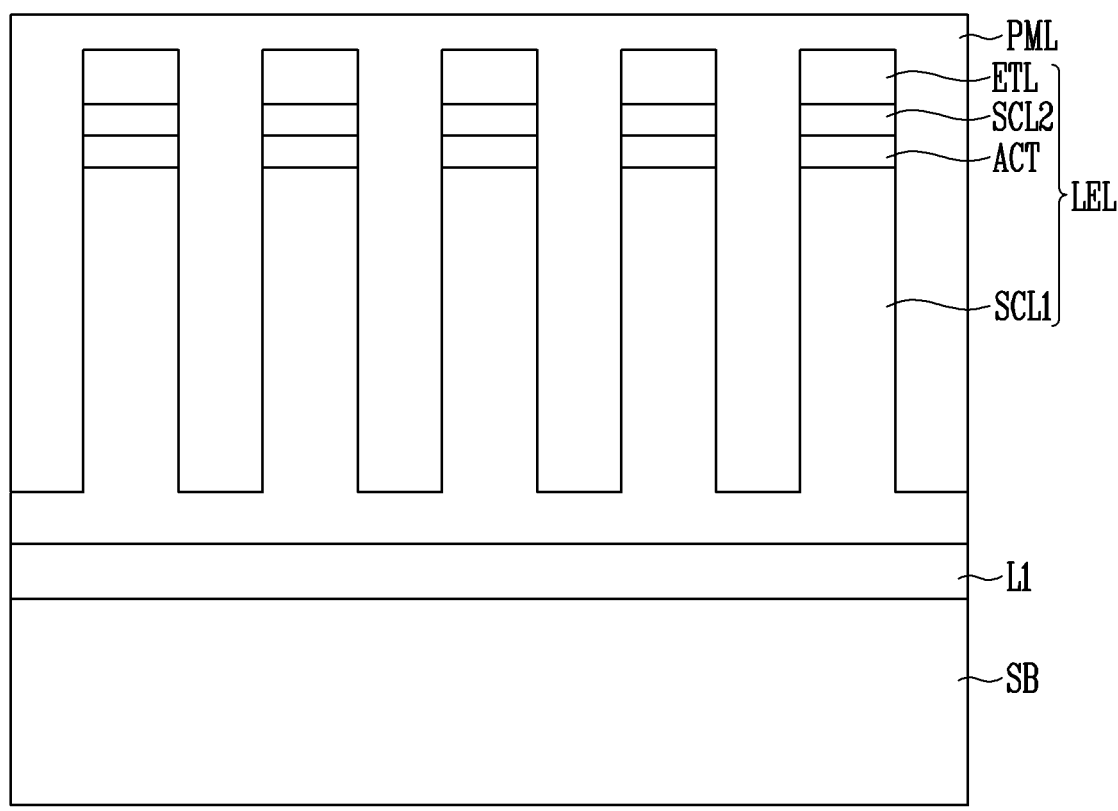

Referring to FIG. 3D, a protective material layer PML may be formed on a surface of the substrate SB including the rod-type light emitting stacks LEL. For example, the protective material layer PML may be formed on the rod-type light emitting stacks LEL by applying organic insulating material (e.g., organic photoresist material) to the entirety of the surface of the substrate SB on which the rod-type light emitting stacks LEL are formed.

In an embodiment, in the case where the protective layer PRL is formed by etching the protective material layer PML through a photo process, the protective material layer PML may be formed of photosensitive material. Furthermore, in case that an atomic layer deposition (ALD) process is used in a process of forming the insulating film INF, the protective material layer PML may be formed of material which is not deformed even at an ALD process temperature (e.g., a temperature ranging from about 200° C. to about 350° C.). For example, the protective material layer PML may be formed of at least one material of polyimide and polyacrylate.

Figure 3E:
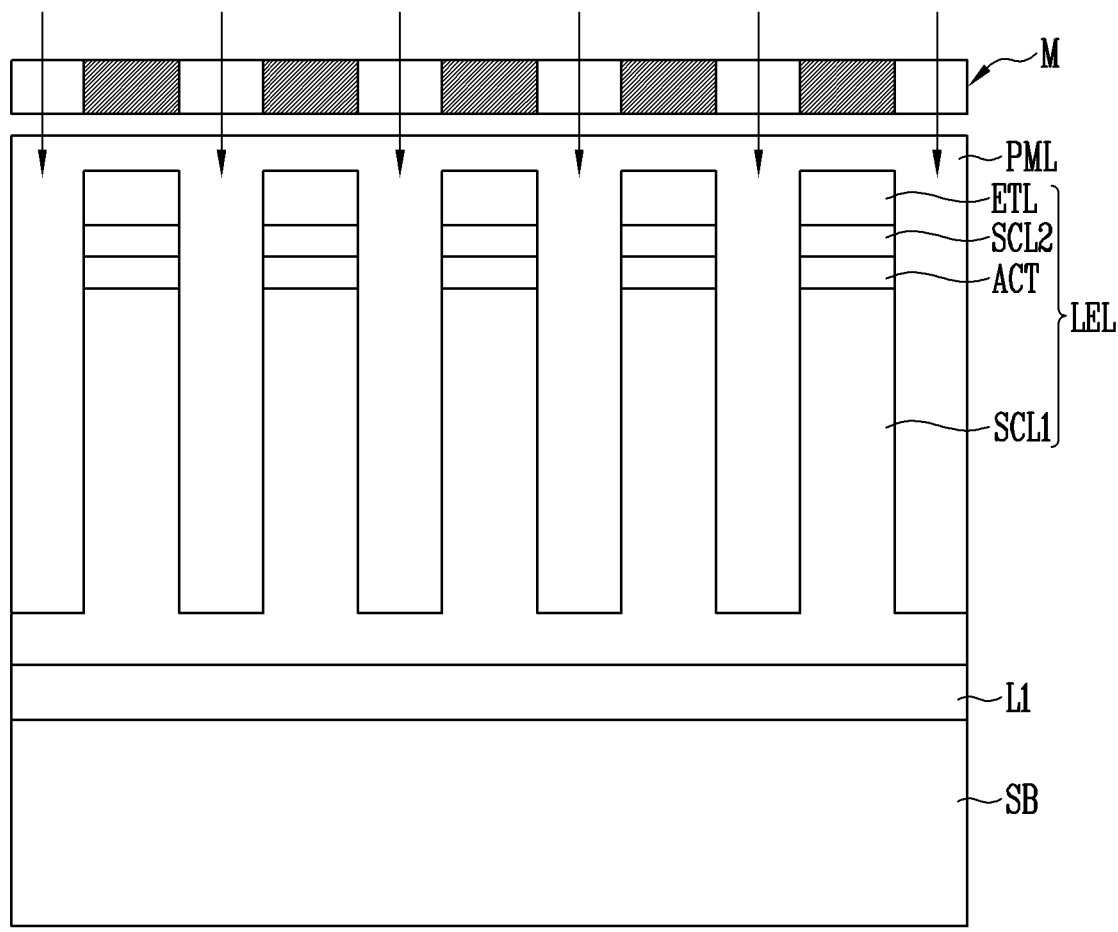
Figure 3F:
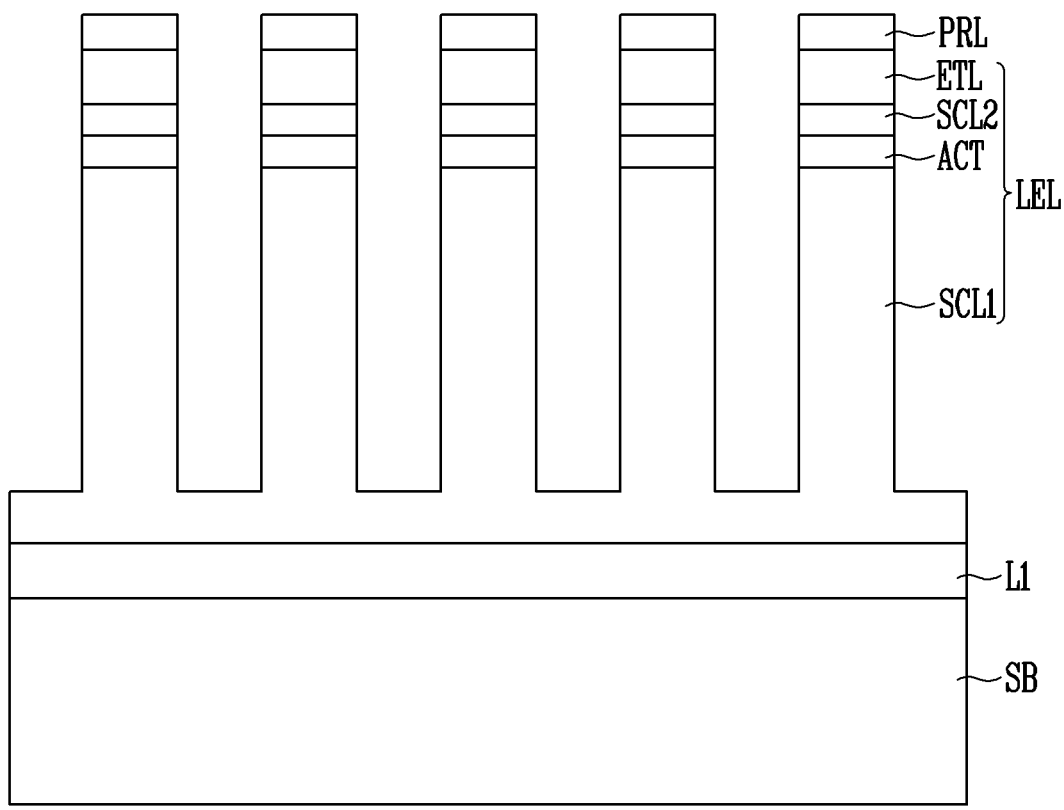

Referring to FIGS. 3E and 3F, a protective layer PRL may be formed on each rod-type light emitting stack LEL by etching the protective material layer PML. In an embodiment, the protective material layer PML may include organic photoresist material and be etched through a photo process.

For example, the protective layer PRL may be formed by applying (e.g., by a coating process) organic photoresist material to the surface of the substrate SB on which the rod-type light emitting stacks LEL are formed, and then patterning the organic photoresist material through the photo process using a mask M.

For example, the protective layer PRL may be formed on the electrode layer ETL of each rod-type light emitting stack LEL by disposing the mask M on the protective material layer PML such that areas between the rod-type light emitting stacks LEL are exposed through or in openings of the mask M, and by then patterning the protective material layer PML through an exposure process, a development process, and a hard bake process (e.g., a bake process to be performed at about 200° C. or greater).

Figure 3G:
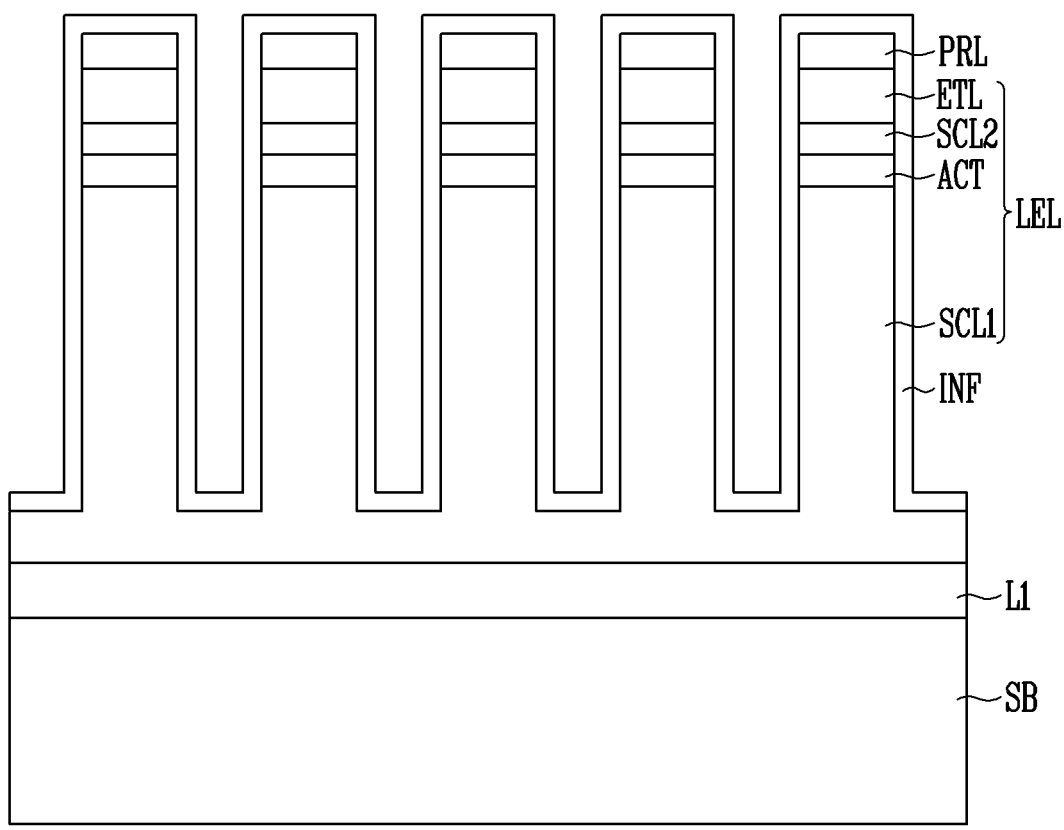

Referring to FIG. 3G, an insulating film INF may be formed on surfaces of the rod-type light emitting stacks LEL and the protective layer PRL. The insulating film INF may be formed by using at least one insulating material among silicon oxide ($SiO_x$), silicon nitride ($SiN_x$), silicon oxynitride ($SiO_xN_y$), aluminum oxide ($Al_2O_3$), and titanium dioxide ($TiO_2$). In an embodiment, the insulating film INF may be deposited by an ALD process on the surface of the substrate SB on which the rod-type light emitting stacks LEL and the protective layer PRL are formed.

Figure 3H:
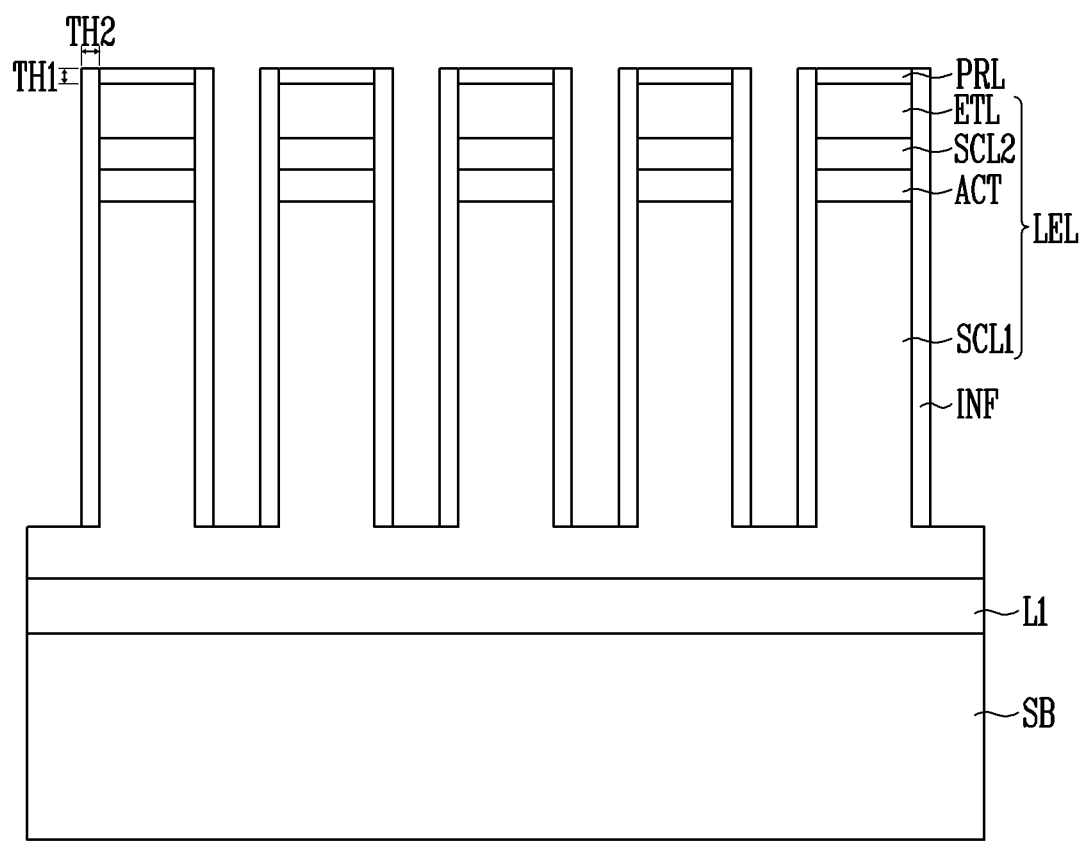

Referring to FIG. 3H, the insulating film INF may be etched such that the protective layer PRL is exposed over each rod-type light emitting stack LEL. In an embodiment, in the step of etching the insulating film INF, the protective layer PRL may also be partially etched by a predetermined thickness so that the protective layer PRL has a thickness TH1 equal to or less than a thickness TH2 of the insulating film INF. In an embodiment, the protective layer PRL may be formed of insulating material having an etch rate equal to or greater than that of the insulating material that forms the insulating film INF, so that the protective layer PRL may be readily etched.

Here, since the electrode layer ETL is protected by the protective layer PRL, the electrode layer ETL may be prevented from being damaged during the process of etching the insulating film INF. Furthermore, even if the insulating film INF is over-etched and thus partially damaged in an area in which the insulating film INF encloses an outer circumferential surface of the protective layer PRL, the insulating film INF may be prevented from being damaged (or the damage may be reduced) in an area in which the insulating film INF encloses the rod-type light emitting stack LEL including the electrode layer ETL, etc.

Referring to FIG. 3I, each light emitting element LD including the light emitting stack LEL, the protective layer PRL, and the insulating film INF may be separated from the substrate SB. Therefore, light emitting elements LD may be formed on the substrate SB. In an embodiment, in case that each rod-type light emitting stack LEL is formed by partially etching the light emitting stack LEL' by a predetermined thickness, a residual layer RL of the light emitting stack LEL' may be separated from the light emitting elements LD along with the substrate SB.

FIG. 4 is a schematic plan view illustrating a display device in accordance with an embodiment. FIG. 4 illustrates a display device, particularly, a display panel PNL provided in the display device, as an example of an electronic device which may use, as a light source, the light emitting element LD described with reference to the embodiments of FIGS. 1, 2A, and 2B. For example, each pixel unit PXU of the display panel PNL and each pixel for forming the pixel unit PXU may include at least one light emitting element LD.

For the sake of explanation, FIG. 4 simply illustrates the structure of the display panel PNL in accordance with an embodiment, focused on a display area DA. In some embodiments, at least one driving circuit, lines, and/or pads, which are not illustrated, may be disposed on the display panel PNL.

Referring to FIG. 4, the display panel PNL in accordance with an embodiment may include a base layer BSL, and pixels disposed on the base layer BSL. The pixels may include first color pixels PXL1, second color pixels PXL2, and/or third color pixels PXL3. In the following embodiments, the term "pixel PXL" or "pixels PXL" will be used to collectively denote any one pixel or two or more kinds of pixels among the first color pixel PXL1, the second color pixel PXL2, and the third color pixel PXL3.

In detail, the display panel PNL and the base layer BSL for forming the display panel PNL may include a display area DA for displaying an image, and a non-display area NDA formed in a predetermined area other than the display area DA. The pixels PXL may be disposed in the display area DA on the base layer BSL.

The display area DA may be disposed in a central area of the display panel PNL, and the non-display area NDA may be disposed in a perimeter area of the display panel PNL in such a way as to enclose the display area DA. The locations of the display area DA and the non-display area NDA may be changed. The display area DA may form a screen on which an image is displayed. The non-display area NDA may be an area formed in a predetermined area other than the display area DA.

The base layer BSL may form a base of the display panel PNL and be a rigid or flexible substrate or film. For example, the base layer BSL may be a rigid substrate made of glass or reinforced glass, a flexible substrate (or thin film) formed of plastic or metal, or at least one insulating layer. The material and/or properties of the base layer BSL are not particularly limited.

An area on the base layer BSL may be defined as the display area DA in which the pixels PXL are disposed, and the other area thereof is defined as the non-display area NDA. For example, the base layer BSL may include the display area DA including pixel areas in which the respective pixels PXL are formed, and the non-display area NDA disposed adjacent to or around the display area DA. Various lines, pads, and/or internal circuits connected to the pixels PXL of the display area DA may be disposed in the non-display area NDA.

The pixels PXL may be arranged in the display area DA. For example, the pixels PXL may be regularly arranged in the display area DA in a stripe or Pentile® arrangement manner or the like. The arrangement of the pixels PXL is not limited thereto, and the pixels PXL may be arranged in the display area DA in various structures and/or methods.

In an embodiment, two or more kinds of pixels PXL emitting different colors of light may be disposed in the display area DA. For example, first color pixels PXL1 configured to emit light of a first color, second color pixels PXL2 configured to emit light of a second color, and third color pixels PXL3 configured to emit light of a third color may be arranged in the display area DA. At least one first color pixel PXL1, at least one second color pixel PXL2, and at least one third color pixel PXL3 disposed adjacent to each other may form a pixel unit PXU which may emit different colors of light.

In an embodiment, the first color pixel PXL1 may be a red pixel which emits red light, a second color pixel PXL2 may be a green pixel which emits green light, and a third color pixel PXL3 may be a blue pixel which emits blue light. In an embodiment, the first color pixel PXL1, the second color pixel PXL2, and the third color pixel PXL3 may respectively include, as light sources, a light emitting element for the first color, a light emitting element for the second color, and a light emitting element for the third color. Thus, the pixels may respectively emit light having the first color, light having the second color, and light having the third color. In an embodiment, each of the first color pixel PXL1, the second color pixel PXL2, and the third color pixel PXL3 may include light emitting elements having the same color, and color filters and photo conversion layers having different colors may be disposed on the respective light emitting elements so that the pixels may respectively emit the first color light, the second color light, and the third color light.

However, the colors, the types, and/or the number of pixels PXL that form each pixel unit PXU are not particularly limited. For example, the color of light to be emitted from each pixel PXL may be changed in various ways.

The pixel PXL may include at least one light source which is driven by a predetermined control signal (e.g., a scan signal and a data signal) and/or a predetermined power supply (e.g., a first power supply and a second power supply). In an embodiment, the light source may include at least one light emitting element LD illustrated in the embodiments of FIGS. 1, 2A, and 2B, e.g., at least one rod-type light emitting element LD having a small size to a degree of the nanoscale to the microscale. Different types of light emitting elements LD may be used as a light source of the pixel PXL.

Furthermore, the pixel PXL may have a structure according to one of embodiments described below. For example, each pixel PXL may have a structure according to one of embodiments disclosed with reference to FIGS. 5 to 8 or a structure corresponding to a combination of at least two of the embodiments.

In an embodiment, the pixel PXL may be formed of an active pixel. However, the types, structures, and/or driving methods of the pixels PXL which may be applied to the display device according to the disclosure are not particularly limited. For example, each pixel PXL may have the structure identical to that of a pixel for passive or active light emitting display devices which have various structures and/or may be operated in various driving schemes.

Figure 5:
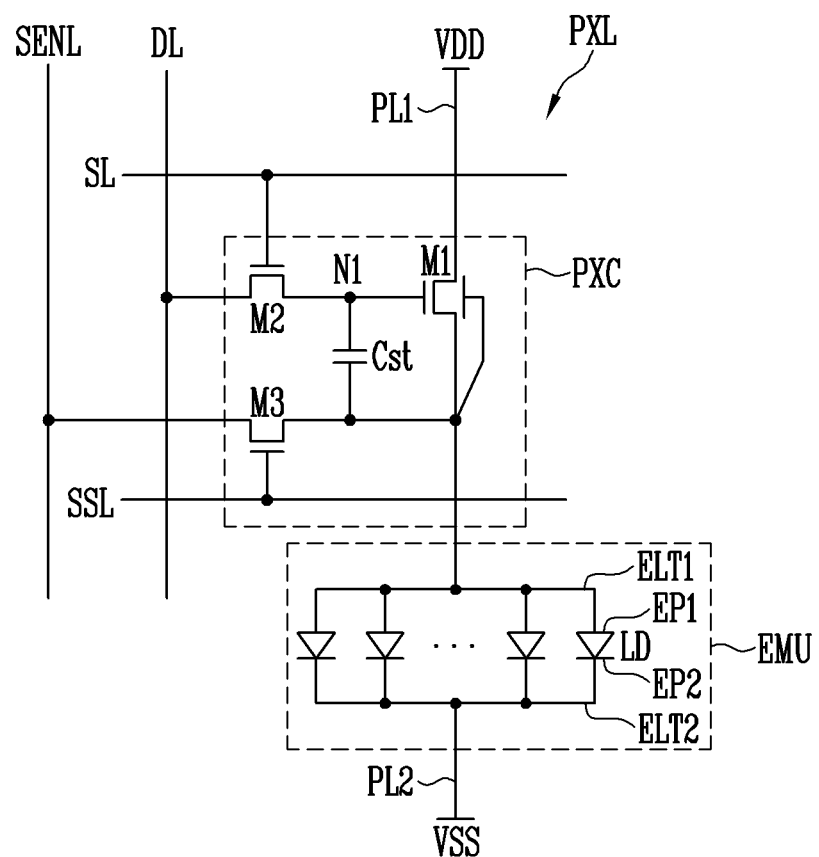
FIG. 5 is a schematic circuit diagram illustrating a pixel of a display device in accordance with an embodiment of the disclosure.

FIG. 5 is a schematic circuit diagram illustrating a pixel PXL in accordance with an embodiment. For example, FIG. 5 illustrates an embodiment of the pixel PXL which may be applied to an active display device. However, the types of pixels PXL and display devices to which embodiments may be applied are not limited thereto.

In an embodiment, the pixel PXL illustrated in FIG. 5 may be one of the first color pixel PXL1, the second color pixel PXL2, and the third color pixel PXL3 which are provided on the display panel PNL of FIG. 4. Furthermore, the first color pixel PXL1, the second color pixel PXL2, and the third color pixel PXL3 may have substantially the same or similar structure.

Referring to FIG. 5, the pixel PXL may include a light emitting unit EMU configured to generate light having a luminance corresponding to a data signal. Furthermore, the pixel PXL may further include a pixel circuit PXC configured to drive the light emitting unit EMU.

The light emitting unit EMU may include at least one light emitting element LD, e.g., light emitting elements LD, electrically connected (or coupled) between the first power supply VDD and a second power supply VSS. In the description of each embodiment, the term "connection (or coupling)" may refer to physical and/or electrical connection (or coupling). Furthermore, the term "connection (or coupling)" may refer to direct or indirect connection (or coupling) and integral or non-integral connection (or coupling).

For example, the light emitting unit EMU may include a first electrode ELT1 (referred also to as "first pixel electrode" or "first alignment electrode") electrically connected to the first power supply VDD via the pixel circuit PXC and a first power line PL1, a second electrode ELT2 (referred also to as "second pixel electrode" or "second alignment electrode") electrically connected to the second power supply VSS through a second power line PL2, and light emitting elements LD electrically connected between the first and second electrodes ELT1 and ELT2 in parallel to each other in the same direction. In an embodiment, the first electrode ELT1 may be an anode electrode, the second electrode ELT2 may be a cathode electrode.

Each of the light emitting elements LD may include a first end EP1 (e.g., a P-type end) electrically connected to the first power supply VDD through the first electrode ELT1 and/or the pixel circuit PXC, and a second end EP2 (e.g., an N-type end) electrically connected to the second power supply VSS through the second electrode ELT2. For example, the light emitting elements LD may be electrically connected in parallel between the first electrode ELT1 and the second electrode ELT2 in a forward direction. Each of the light emitting elements LD electrically connected in the forward direction between the first power supply VDD and the second power supply VSS may form a valid light source. The valid light sources may form the light emitting unit EMU of the pixel PXL.

The first power supply VDD and the second power supply VSS may have different potentials to allow the light emitting elements LD to emit light. For example, the first power supply VDD may be set as a high-potential power supply, and the second power supply VSS may be set as a low-potential power supply. Here, a difference in potential between the first power supply VDD and the second power supply VSS may be set to a voltage equal to or greater than a threshold voltage of the light emitting elements LD during an emission period of the pixel PXL.

The first ends EP1 of the light emitting elements LD that form each light emitting unit EMU may be electrically connected in common to the pixel circuit PXC through an electrode of the light emitting unit EMU (e.g., the first electrode ELT1 of each pixel PXL) and may be electrically connected to the first power supply VDD through the pixel circuit PXC and the first power line PL1. The second ends EP2 of the light emitting elements LD may be electrically connected in common to the second power supply VSS through another electrode of the light emitting unit EMU (e.g., the second electrode ELT2 of each pixel PXL) and the second power line PL2.

The light emitting elements LD may emit light having a luminance corresponding to driving current supplied thereto through the corresponding pixel circuit PXC. For example, during each frame period, the pixel circuit PXC may supply driving current, corresponding to a grayscale value to be expressed in a corresponding frame, to the light emitting unit EMU. The driving current supplied to the light emitting unit EMU may be distributed to the light emitting elements LD electrically connected in the forward direction. Therefore, each of the light emitting elements LD may emit light having a luminance corresponding to current applied thereto, so that the light emitting unit EMU may emit light having a luminance corresponding to the driving current.

In an embodiment, the light emitting unit EMU may further include at least one invalid light source, as well as including the light emitting elements LD that form the respective valid light sources. For example, in at least one serial stage, at least one invalid light emitting element which is oriented in a reverse direction, or which has at least one end that floats, may be further provided. The invalid light emitting element may remain in a disabled state even in case that a predetermined driving voltage (e.g., a forward driving voltage) is applied between the first and second electrodes ELT1 and ELT2, and thus remain in a substantially non-emission state.

Although FIG. 5 illustrates an embodiment in which the pixel PXL includes the light emitting unit EMU having a parallel structure, the disclosure is not limited thereto. For example, the pixel PXL may also include a light emitting unit EMU having a serial structure or a serial/parallel structure. In this case, the light emitting unit EMU may include light emitting elements LD electrically connected in series or parallel between the first electrode ELT1 and the second electrode ELT2

The pixel circuit PXC may be electrically connected between the first power supply VDD and the first electrode ELT1. The pixel circuit PXC may be electrically connected to a scan line SL and a data line DL of the corresponding pixel PXL. Furthermore, pixel circuit PXC may be selectively or optionally further connected to a sensing signal line SSL and a sensing line SENL.

The pixel circuit PXC may include a first transistor M1, a second transistor M2, a third transistor M3, and a storage capacitor Cst.

The first transistor M1 may be electrically connected between the first power supply VDD and the first electrode ELT1 of the light emitting unit EMU. A gate electrode of the first transistor M1 may be electrically connected to a first node N1. The first transistor M1 may control driving current to be supplied to the light emitting unit EMU in response to a voltage of the first node N1. In other words, the first transistor M1 may be a driving transistor configured to control the driving current of the pixel PXL.

Furthermore, the first transistor M1 may selectively further include a back gate electrode electrically connected to the first electrode ELT1. The back gate electrode may overlap the gate electrode with an insulating layer interposed therebetween.

The second transistor M2 may be electrically connected between the data line DL and the first node N1. A gate electrode of the second transistor M2 may be electrically connected to the scan line SL. In case that a scan signal of a gate-on voltage (e.g., low-level voltage) is supplied from the scan line SL to the second transistor M2, the second transistor M2 may be turned on to electrically connect the data line DL with the first node N1.

During each frame period, a data signal of a corresponding frame may be supplied to the data line DL, and the data signal may be transmitted to the first node N1 through the second transistor M2 that is turned on during a period in which the scan signal having the gate-on voltage is supplied to the scan line SL. In other words, the second transistor M2 may be a switching transistor configured to transmit each data signal to the interior of the pixel PXL.

An electrode of the storage capacitor Cst may be electrically connected to the first node N1, and the other electrode thereof may be electrically connected to the first electrode ELT1 of the light emitting unit EMU (or a second electrode of the first transistor M1). The storage capacitor Cst may charge a voltage corresponding to a data signal to be supplied to the first node N1 during each frame period.

The third transistor M3 may be electrically connected between the first electrode ELT1 of the light emitting unit EMU and the sensing line SENL. A gate electrode of the third transistor M3 may be electrically connected to the sensing signal line SSL. The third transistor M3 may transmit a voltage applied to the first electrode ELT1 of the light emitting unit EMU (or a voltage value applied to the anode electrode of the light emitting element LD) to the sensing line SENL in response to a sensing signal supplied to the sensing signal line SSL during a predetermined sensing period. The voltage transmitted through the sensing line SENL may be provided to an external circuit (e.g., timing controller). The external circuit may extract information about the characteristics of each pixel PXL (e.g., a threshold voltage of the first transistor M1, or the like) based on the provided voltage value. The extracted characteristic information may be used to convert image data to compensate for a deviation in characteristics between the pixels PXL.

Although FIG. 5 illustrates the transistors, e.g., the first, second, and third transistors M1, M2, and M3, included in the pixel circuit PXC as being N-type transistors, the disclosure is not limited thereto. At least one of the first, second, and third transistors M1, M2, and M3 may be changed to a P-type transistor. In an embodiment, the pixel circuit PXC may include P- and N-type transistors. For example, some of the transistors included in the pixel circuit PXC may be P-type transistors, and the other transistors may be N-type transistors. In this case, a voltage level of a control signal (e.g., scan signal, data signal, and/or sensing signal) for driving each transistor may be adjusted according to the types of the transistors.

The structure and driving method of the pixel PXL may be changed in various ways according to embodiments. For instance, the pixel circuit PXC may not only be formed of the pixel circuit of the embodiment illustrated in FIG. 5 but may also be formed of a pixel circuit which may have various structures and/or be operated in various driving manners.

For example, the pixel circuit PXC may not include the third transistor M3. Furthermore, the pixel circuit PXC may further include other circuit elements such as a transistor configured to compensate for the threshold voltage of the first transistor M1, a transistor configured to initialize the voltage of the first electrode ELT1 of the first node N1 or the light emitting unit EMU, a transistor configured to remove a period in which driving current is supplied to the light emitting unit EMU, and/or a boosting capacitor configured to boost the voltage of the first node N1.

In an embodiment, in the case where each pixel PXL is included in a passive light emitting display device or the like, the pixel circuit PXC may be omitted. Each of the first and second electrodes ELT1 and ELT2 of the light emitting unit EMU may be directly connected to the scan line SL, the data line DL, the first power line PL1, the second power line PL2, other signal lines or power lines, etc.

Figure 6A:
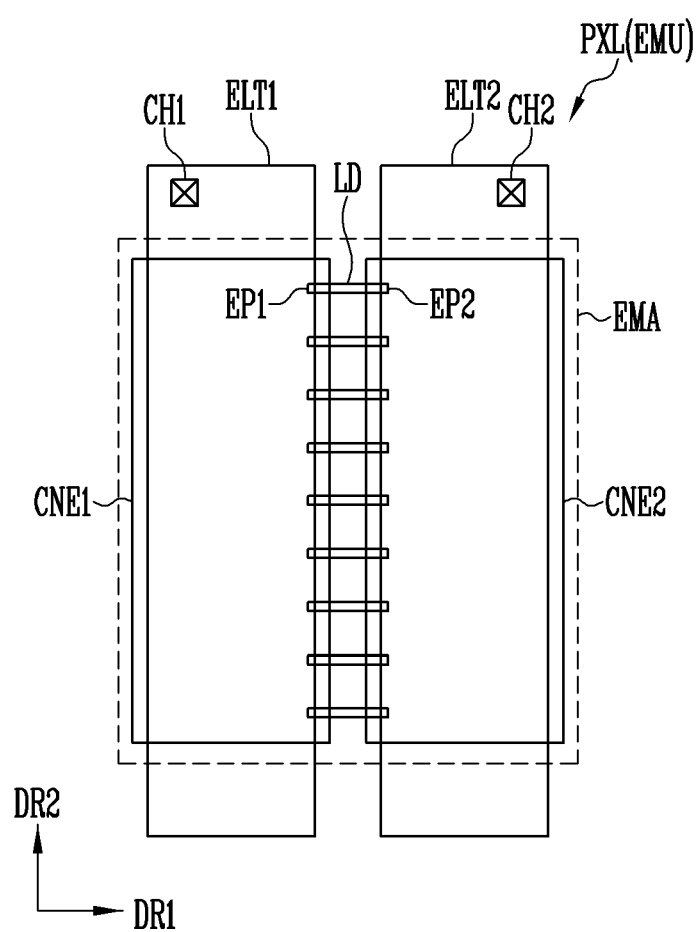
FIGS. 6A and 6B each are a schematic plan view illustrating a pixel of a display device in accordance with an embodiment of the disclosure.
Figure 6B:
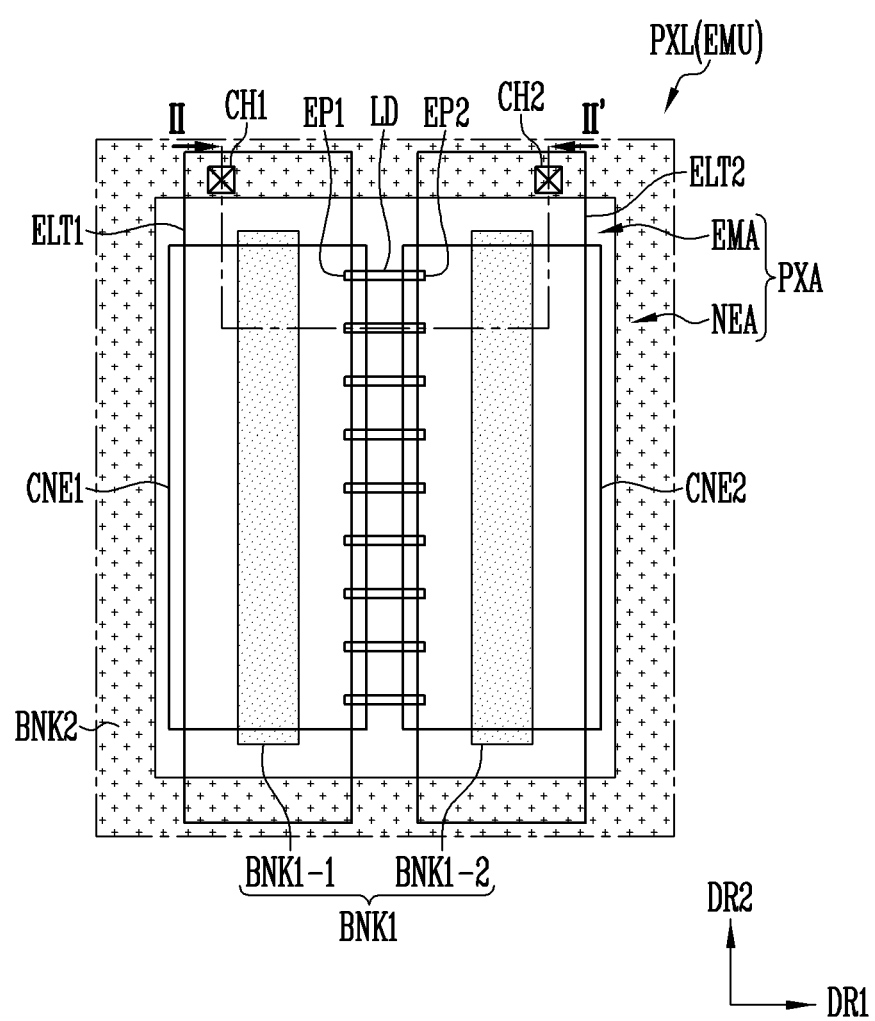

FIGS. 6A and 6B each are a schematic plan view illustrating a pixel PXL of a display device in accordance with an embodiment. FIGS. 6A and 6B illustrate the structure of the pixel PXL, focused on a light emitting unit EMU of the pixel PXL. For example, FIGS. 6A and 6B illustrate a structure of the light emitting unit EMU including first and second electrodes ELT1 and ELT2 and light emitting elements LD electrically connected in parallel between the first and second electrodes ELT1 and ELT2. Here, the connection structure of the light emitting elements LD and the structure of the light emitting unit EMU may be changed in various ways.

Furthermore, FIGS. 6A and 6B illustrate an embodiment in which each light emitting unit EMU is electrically connected through first and second contact holes CH1 and CH2 to a predetermined power line (e.g., first and/or second power lines PL1 and PL2), a circuit element (e.g., at least one circuit element that forms the pixel circuit PXC), and/or a signal line (e.g., a scan line SL and/or a data line DL). However, the disclosure is not limited thereto. For example, in an embodiment, at least one of the first and second electrodes ELT1 and ELT2 of each pixel PXL may be directly connected to a predetermined power line and/or signal line without passing through a contact hole and/or an intermediate line.

Referring to FIG. 6A, the pixel PXL may include a first electrode ELT1 and a second electrode ELT2 which are disposed in each emission area EMA, and at least one light emitting element LD disposed between the first and second electrodes ELT1 and ELT2 (e.g., light emitting elements LD electrically connected in parallel between the first and second electrodes ELT1 and ELT2). Here, the phrase "the light emitting element LD is disposed between the first and second electrodes ELT1 and ELT2" may indicate that in a plan view, at least one area of the light emitting element LD is positioned in an area between the first and second electrodes ELT1 and ELT2. The pixel PXL may further include a first contact electrode CNE1 and a second contact electrode CNE2 which may electrically connect the light emitting element LD to the first and second electrodes ELT1 and ELT2.

The first electrode ELT1 and the second electrode ELT2 may be disposed in each pixel area in which the pixel PXL is provided and/or formed. For example, the first electrode ELT1 and the second electrode ELT2 may be disposed in the emission area EMA of each pixel PXL.

In an embodiment, each pixel area may refer to a pixel circuit area in which circuit elements for forming the corresponding pixel PXL are disposed, and an emission area EMA in which the light emitting unit EMU of the pixel PXL is disposed. The emission area EMA may be an area in which the light emitting elements LD (particularly, valid light sources connected in a forward direction between the first and second electrodes ELT1 and ELT2) that form the light emitting unit EMU of each pixel PXL are disposed. Furthermore, predetermined electrodes electrically connected to the light emitting elements LD (e.g., the first and second electrodes ELT1 and ELT2 and/or the first and second contact electrodes CNE1 and CNE2) or areas of the electrodes may be disposed in the emission area EMA.

The emission area EMA may be enclosed by a light shielding and/or reflective bank structure (e.g., a pixel define layer and/or a black matrix) which is formed between the pixels PXL to define each pixel area and the emission area EMA formed in the pixel area. For example, the bank structure (corresponding to "second bank BNK2" of FIG. 6B) for enclosing the emission area EMA may be disposed around the emission area EMA.

The first and second electrodes ELT1 and ELT2 may be spaced apart from each other. For example, the first and second electrodes ELT1 and ELT2 may be arranged in parallel in each emission area EMA at positions spaced apart from each other by a predetermined distance in a first direction DR1. In an embodiment, the first direction DR1 may be a horizontal direction (or a row direction), but the disclosure is not limited thereto.

In an embodiment, the first and/or second electrodes ELT1 and ELT2 may have a pattern divided by pixels PXL, or electrically connected in common to pixels PXL. For example, as illustrated in FIG. 6A, the first second electrode ELT1 and ELT2 may have an independent pattern in which the opposite ends thereof are cut off in the perimeter of the corresponding emission area EMA or in the emission area EMA. In an embodiment, the first electrode ELT1 may have an independent pattern which is cut off in the perimeter of the corresponding emission area EMA or in the emission area EMA. The second electrode ELT2 may include an end that extends in the first direction DR1 or a second direction DR2 and is integrally connected to (or integral with) the second electrode ELT2 of another pixel PXL adjacent thereto in the first direction DR1 or the second direction DR2. In an embodiment, the second direction DR2 may be a vertical direction (or column direction), but the disclosure is not limited thereto.

Here, during a process of forming the pixel PXL, particularly, before the alignment of the light emitting elements LD is completed, the first electrodes ELT1 of the pixels PXL disposed in the display area DA may be electrically connected to each other, and the second electrodes ELT2 of the pixels PXL may be electrically connected to each other. For example, before the alignment of the light emitting elements LD is completed, the first electrodes ELT1 of the pixels PXL may be integrally or non-integrally formed and electrically connected to each other, and the second electrodes ELT2 of the pixels PXL may be integrally or non-integrally formed and electrically connected to each other. In the case where the first electrodes ELT1 or the second electrodes ELT2 of the pixels PXL are non-integrally formed, the first electrodes ELT1 or the second electrodes ELT2 may be electrically connected to each other by at least one contact hole and/or a bridge pattern.

The first and second electrodes ELT1 and ELT2 (or alignment lines before being divided into respective first and second electrodes ELT1 and ELT2) may be respectively supplied with a first alignment signal (or a first alignment voltage) and a second alignment signal (or a second alignment voltage) in the step of aligning the light emitting elements LD. For example, one of the first and second electrodes ELT1 and ELT2 may be supplied with an AC alignment signal, and the other one thereof may be supplied with an alignment voltage having a constant voltage level (e.g., a ground voltage).

In other words, in the step of aligning the light emitting elements LD, predetermined alignment signals may be applied to the first and second electrodes ELT1 and ELT2. Therefore, an electric field may be formed between the first and second electrodes ELT1 and ELT2. The light emitting elements LD supplied to each pixel area (particularly, the emission area EMA of each pixel PXL) may be self-aligned between the first and second electrodes ELT1 and ELT2 by the electric field. For example, the light emitting elements LD may be aligned between the first and second electrodes ELT1 and ELT2 such that the first ends EP1 and the second end EP2 thereof are respectively adjacent to the first electrode ELT1 and the second electrode ELT2. After the alignment of the light emitting elements LD has been completed, at least the first electrodes ELT1 may be disconnected from each other between the pixels PXL so that the pixels PXL may be individually driven.

The first and second electrodes ELT1 and ELT2 may have various shapes. For example, each of the first and second electrodes ELT1 and ELT2 may have a bar shape extending in a direction. For example, each of the first and second electrodes ELT1 and ELT2 may have a bar shape extending in the second direction DR2 intersecting (e.g., perpendicular to) the first direction DR1. In an embodiment, each of the first and second electrodes ELT1 and ELT2 may have a bent or curved shape in at least one area. Furthermore, each of the first and second electrodes ELT1 and ELT2 may have a uniform width or be changed in width by areas.

The shapes and/or structures of the first and second electrodes ELT1 and ELT2 may be changed in various ways. For example, the first electrode ELT1 and/or the second electrode ELT2 may be formed of spiral or circular electrodes.

Although FIG. 6A illustrates an embodiment in which a first electrode ELT1 and a second electrode ELT2 are disposed in each emission area EMA, the numbers and/or relative arrangements of first and second electrodes ELT1 and ELT2 disposed in each pixel PXL may be changed in various ways.

In the case where first electrodes ELT1 are disposed in a pixel PXL, the first electrodes ELT1 may be integrally or non-integrally connected to (or integral with) each other. For example, the first electrodes ELT1 may be integrally connected to each other or connected to each other by a bridge pattern disposed on a layer (e.g., a circuit layer on which the pixel circuit PXC is disposed) different from that of the first electrodes ELT1. Likewise, in the case where second electrodes ELT2 are disposed in a pixel PXL, the second electrodes ELT2 may be integrally or non-integrally connected to each other.

In other words, in the disclosure, the shapes, the numbers, the orientations, and/or the relative arrangements of the first and second electrodes ELT1 and ELT2 may be changed in various ways.

In an embodiment, the first electrode ELT1 may be electrically connected to a predetermined circuit element (e.g., at least one transistor that forms the pixel circuit PXC), a power line (e.g., the first power line PL1), and/or a signal line (e.g., the scan line SL, the data line DL, or a predetermined control line) through a first contact hole CH1. In an embodiment, the first electrode ELT1 may be directly connected to a predetermined power line or signal line.

In an embodiment, the first electrode ELT1 may be electrically connected to a predetermined circuit element disposed thereunder through the first contact hole CH1 and may be electrically connected to a first line through the circuit element. The first line may be the first power line PL1 for supplying the first power supply VDD, but the disclosure is not limited thereto.

In an embodiment, the second electrode ELT2 may be electrically connected a predetermined circuit element (e.g., at least one transistor that forms the pixel circuit PXC), a power line (e.g., the second power line PL2), and/or a signal line (e.g., the scan line SL, the data line DL, or a predetermined control line) through a second contact hole CH2. In an embodiment, the second electrode ELT2 may be directly connected to a predetermined power line or signal line.

In an embodiment, the second electrode ELT2 may be electrically connected through the second contact hole CH2 to a second line disposed under the second electrode ELT2. The second line may be the second power line PL2 for supplying the second power supply VSS, but the disclosure is not limited thereto.

Each of the first and second electrodes ELT1 and ELT2 may have a single-layer or multi-layer structure. For example, the first electrode ELT1 may include at least one reflective electrode layer including reflective conductive material and may selectively further include at least one transparent electrode layer and/or at least one conductive capping layer. Likewise, the second electrode ELT2 may include at least one reflective electrode layer including reflective conductive material and may selectively further include at least one transparent electrode layer and/or at least one conductive capping layer. The reflective conductive material may be one of various kinds of metal including metal having a large reflectivity in a visible light wavelength band, e.g., aluminum (Al), gold (Au), and silver (Ag), but the disclosure is not limited thereto.

The light emitting elements LD may be disposed between the first electrode ELT1 and the second electrode ELT2. For example, the light emitting elements LD may be arranged in parallel between the first electrode ELT1 and the second electrode ELT2. For example, each light emitting element LD may be aligned between the first electrode ELT1 and the second electrode ELT2 in the first direction DR1 and may be electrically connected between the first and second electrodes ELT1 and ELT2.

FIG. 6A illustrates that the light emitting elements LD are uniformly aligned in the first direction DR1, but the disclosure is not limited thereto. For example, at least one of the light emitting elements LD may be oriented in a diagonal direction with respect to the first and second directions DR1 and DR2 between the first and second electrodes ELT1 and ELT2.

In an embodiment, each of the light emitting elements LD may be a light emitting element which is made of material having an inorganic crystal structure and has a subminiature size, e.g., ranging from the nanoscale to the microscale, but the disclosure is not limited thereto. Furthermore, each light emitting element LD may be a rod-type light emitting element as illustrated in FIGS. 1, 2A, and 2B, but the disclosure is not limited thereto.

Each light emitting element LD may include a first end EP1 disposed to face the first electrode ELT1, and a second end EP2 disposed to face the second electrode ELT2. In an embodiment, each of the light emitting element LD may overlap the first and/or second electrodes ELT1 and ELT2 or may not overlap the first and/or second electrodes ELT1 and ELT2.

The respective first ends EP1 of the light emitting elements LD may be electrically connected to the first electrode ELT1. The respective second ends EP2 of the light emitting elements LD may be electrically connected to the second electrode ELT2. For example, the respective first ends EP1 of the light emitting elements LD may be electrically connected to the first electrode ELT1 through the first contact electrode CNE1. The respective second ends EP2 of the light emitting elements LD may be electrically connected to the second electrode ELT2 through the second contact electrode CNE2. In an embodiment, the respective first ends EP1 of the light emitting elements LD may directly contact the first electrode ELT1 and be electrically connected to the first electrode ELT1. Likewise, the respective second ends EP2 of the light emitting elements LD may directly contact the second electrode ELT2 and be electrically connected to the second electrode ELT2. In this case, the first contact electrode CNE1 and/or the second contact electrode CNE2 may be selectively formed.

The light emitting elements LD may be prepared in a diffused form in a predetermined solution and then be supplied to each pixel area (particularly, the emission area EMA of each pixel PXL) by various methods such as an inkjet method or a slit coating method. For example, the light emitting elements LD may be mixed with a volatile solvent and supplied to the emission area EMA of each pixel PXL. Here, if predetermined alignment voltages (or alignment signals) are applied to the first and second electrodes ELT1 and ELT2 of the pixels PXL, an electric field may be formed between the first and second electrodes ELT1 and ELT2, whereby the light emitting elements LD may be aligned between the first and second electrodes ELT1 and ELT2. After the light emitting elements LD have been aligned, the solvent may be removed by a volatilization method or other methods. In this way, the light emitting elements LD may be reliably arranged between the first and second electrodes ELT1 and ELT2.

The first contact electrode CNE1 and the second contact electrode CNE2 may be respectively formed on the opposite ends, for example, the first and second ends EP1 and EP2, of the light emitting elements LD. Therefore, the light emitting elements LD may be reliably connected between the first and second electrodes ELT1 and ELT2.

The first contact electrode CNE1 may be disposed on the first electrode ELT1 and the first end EP1 of at least one light emitting element LD adjacent thereto such that the first contact electrode CNE1 overlaps the first electrode ELT1 and the first end EP1 of the light emitting element LD. For example, the first contact electrode CNE1 may be disposed on the first electrode ELT1 and the first ends EP1 of light emitting elements LD adjacent thereto such that the first contact electrode CNE1 overlaps the first electrode ELT1 and the first ends EP1 of the light emitting elements LD.

The first contact electrode CNE1 may electrically connect the first electrode ELT1 with the first ends EP1 of the light emitting elements LD. Furthermore, the first contact electrode CNE1 may stably fix the first ends EP1 of the light emitting elements LD.

The second contact electrode CNE2 may be disposed on the second electrode ELT2 and the second end EP2 of at least one light emitting element LD adjacent thereto such that the second contact electrode CNE2 overlaps the second electrode ELT2 and the second end EP2 of the light emitting element LD. For example, the second contact electrode CNE2 may be disposed on the second electrode ELT2 and the second ends EP2 of light emitting elements LD adjacent thereto such that the second contact electrode CNE2 overlaps the second electrode ELT2 and the second ends EP2 of the light emitting elements LD.

The second contact electrode CNE2 may electrically connect the second electrode ELT2 with the second ends EP2 of the light emitting elements LD. Furthermore, the second contact electrode CNE2 may stably fix the second ends EP1 of the light emitting elements LD.

FIG. 6A illustrates an embodiment in which the light emitting elements LD are electrically connected in parallel, but the disclosure is not limited thereto. For example, the pixel PXL may include a light emitting unit EMU having a serial or serial/parallel structure including light emitting elements LD connected to at least two serial stages. In this case, the light emitting unit EMU may further include at least one intermediate electrode connected between the first and second electrodes ELT1 and ELT2 through the light emitting elements LD, and/or at least one contact electrode which electrically connects the intermediate electrode to the light emitting elements LD adjacent thereto.

In the foregoing embodiment, each light emitting element LD electrically connected between the first and second electrodes ELT1 and ELT2 in the forward direction may form a valid light source of the corresponding pixel PXL. Such valid light sources may collectively form the light emitting unit EMU of the corresponding pixel PXL.

Referring to FIG. 6B, the pixel PXL may further include a first bank BNK1 which overlaps the first and second electrodes ELT1 and ELT2, and a second bank BNK2 which encloses each emission area EMA.

The first bank BNK1 (referred also to as "partition wall") may be disposed to overlap areas of the first and second electrodes ELT1 and ELT2. For example, the first bank BNK1 may be disposed under the first and second electrodes ELT1 and ELT2 such that in a plan view, the first bank BNK1 overlaps an area of each of the first and second electrodes ELT1 and ELT2.

The first bank BNK1 may form a wall structure around the light emitting elements LD and be formed in a separate or integral pattern. For example, the first bank BNK1 may include a 1-1-th bank BNK1-1 and a 1-2-th bank BNK1-2 which are separated from each other. The 1-1-th bank BNK1-1 may overlap the first electrode ELT1 and the first contact electrode CNE1. The 1-2-th bank BNK1-2 may overlap the second electrode ELT2 and the second contact electrode CNE2. In an embodiment, the first bank BNK1 may be formed of an integral bank which includes an opening or a groove corresponding to an area in which the light emitting elements LD are disposed and encloses the area in which the light emitting elements LD are disposed.

In the case where the first bank BNK1 is disposed under an area of each of the first and second electrodes ELT1 and ELT2, the first and second electrodes ELT1 and ELT2 may protrude upward in an area in which the first bank BNK1 is formed. The first bank BNK1 may form a reflective bank (referred also to as "reflective partition wall") along with the first and second electrodes ELT1 and ELT2. For example, the first and second electrodes ELT1 and ELT2 and/or the first bank BNK1 may be formed of material having reflexibility, or a reflective layer may be formed on protruding sidewalls of the first and second electrodes ELT1 and ELT2 and/or the first bank BNK1. Therefore, light emitted from the first and second ends EP1 and EP2 of the light emitting elements LD that face the first and second electrodes ELT1 and ELT2 may be more effectively guided in a frontal direction of the display panel PNL. Here, the phrase "frontal direction of the display panel PNL" may include a direction perpendicular to the display panel PNL (e.g., an upward direction of the pixel PXL) and may mean directions belonging to a predetermined viewing angle range. As such, in the case where an area of each of the first and second electrodes ELT1 and ELT2 protrudes upward by the first bank BNK1, the optical efficiency of the pixel PXL may be enhanced.

The second bank BNK2 may be a structure which defines the emission area EMA of each pixel PXL and may be, for example, a pixel defining layer. For example, the second bank BNK2 may be disposed to enclose the emission area EMA of each pixel PXL in a boundary area of each pixel area PXA in which the pixel PXL is provided, and/or in an area between adjacent pixels PXL.

The second bank BNK2 may or may not partially overlap the first and/or second electrodes ELT1 and ELT2. For example, the first and/or second electrodes ELT1 and ELT2 may extend to a non-emission area NEA to overlap the second bank BNK2 or may be disconnected in the emission area EMA not to overlap the second bank BNK2.

The second bank BNK2 may or may not overlap the first and/or second contact holes CH1 and CH2. For example, the first and/or second contact holes CH1 and CH2 may be formed in the non-emission area NEA to overlap the second bank BNK2 or may be formed in each emission area EMA not to overlap the second bank BNK2.

The second bank BNK2 may include at least one light shielding and/or reflective material, thereby preventing light leakage between adjacent pixels PXL. For example, the second bank BNK2 may include at least one black matrix material (e.g., at least one well-known light shielding material) among different kinds of black matrix materials, and/or color filter material having a specific color. For example, the second bank BNK2 may be formed in a black opaque pattern to block transmission of light.

Furthermore, the second bank BNK2 may function as a dam structure for defining each emission area EMA to which the light emitting elements LD are to be supplied in the step of supplying the light emitting elements LD to each pixel PXL. For example, since each emission area EMA is defined by the second bank BNK2, a desired kind and/or amount of light emitting element ink may be supplied to the emission area EMA.

In an embodiment, the second bank BNK2 and the first banks BNK1 may be formed on the same layer and at the same time during the process of forming the first banks BNK1. In an embodiment, the second bank BNK2 may be formed on a layer identical to or different from that of the first banks BNK1 during a process separated from the process of forming the first banks BNK1.

Figure 7A:
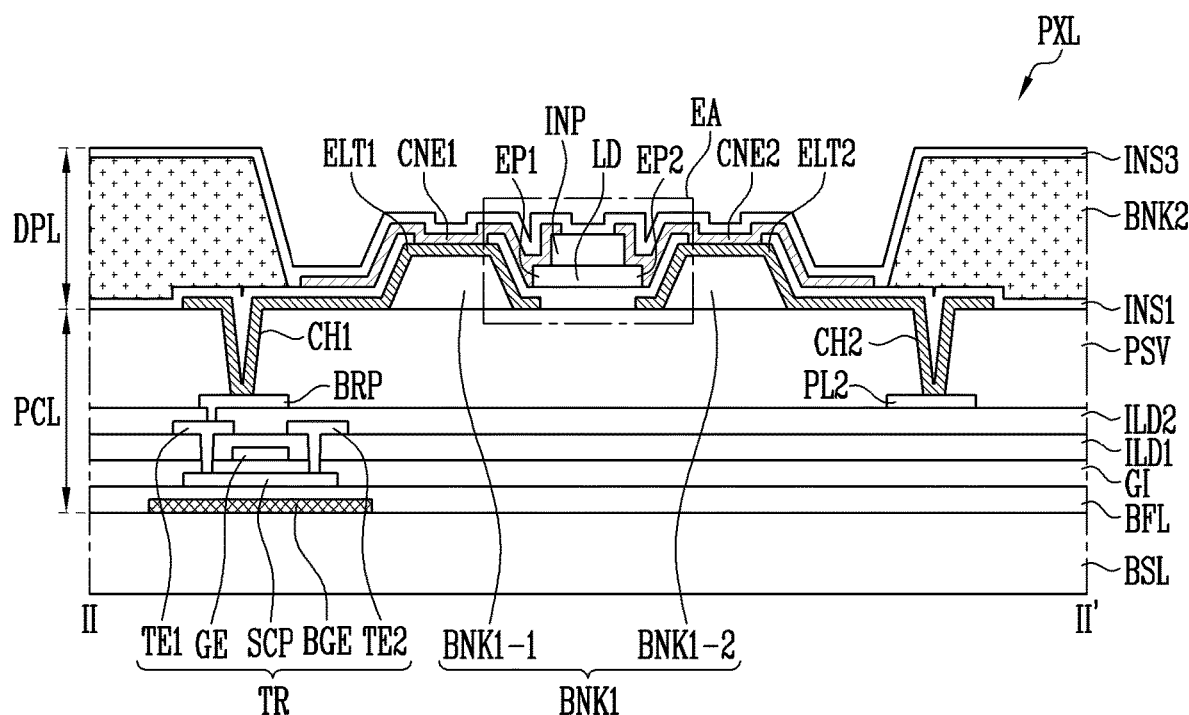
FIGS. 7A and 7B each are a schematic cross-sectional view illustrating a pixel of a display device in accordance with an embodiment of the disclosure.
Figure 7B:
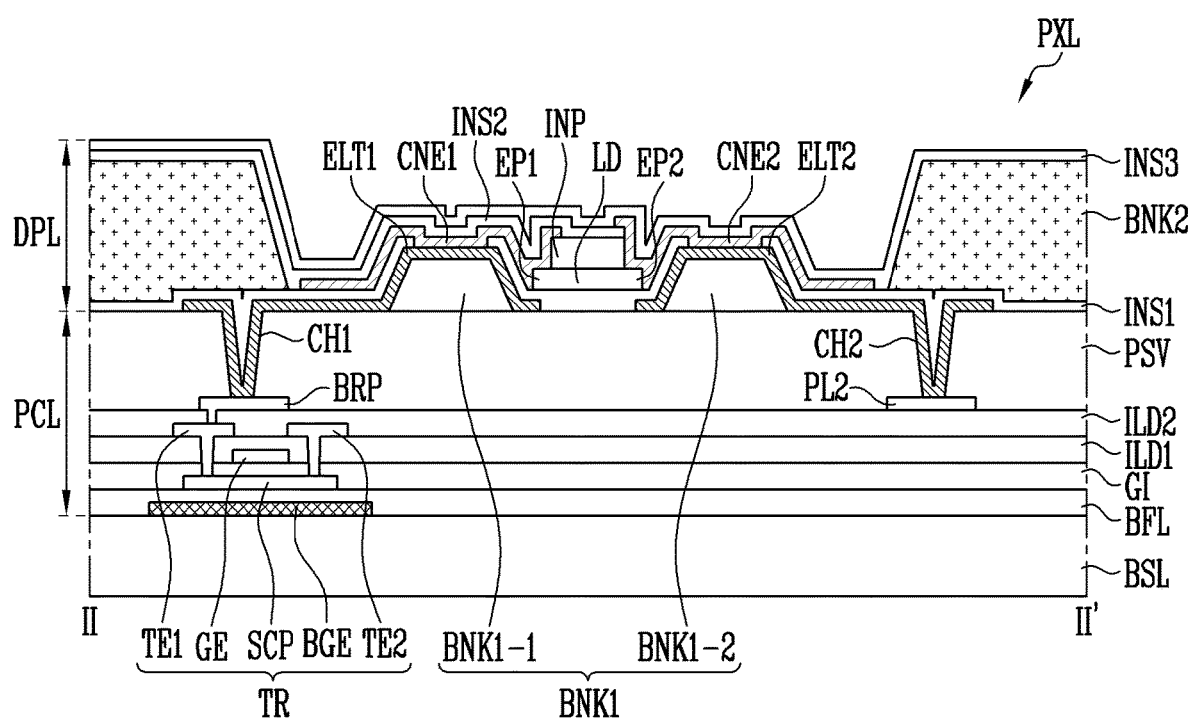

FIGS. 7A and 7B each are a schematic sectional view illustrating a pixel PXL of a display device in accordance with an embodiment. For example, FIGS. 7A and 7B illustrate different embodiments of a cross-section of the pixel PXL, taken along line II-II' of FIG. 6B. Unlike the embodiment of FIG. 7A, the embodiment of FIG. 7B may further include a second insulating layer INS2 disposed on the first contact electrode CNE1.

FIGS. 7A and 7B illustrate a transistor TR (e.g., a transistor electrically connected to the first electrode ELT1 through the first contact hole CH1 and a bridge pattern BRP) as an example of circuit elements which can be disposed on a circuit layer PCL. Furthermore, FIGS. 7A and 7B illustrate a second power line PL2 connected to the second electrode ELT2 through the second contact hole CH2 as an example of a line which may be disposed on the circuit layer PCL.

Referring to FIGS. 4 to 7B, the pixel PXL according to an embodiment and the display device including the pixel PXL may include the circuit layer PCL and a display layer DPL which overlap each other on a surface of a base layer BSL. For example, the display area DA may include the circuit layer PCL disposed on the surface of the base layer BSL, and the display layer DPL disposed on the circuit layer PCL. However, relative positions of the circuit layer PCL and the display layer DPL on the base layer BSL may be changed according to embodiments.

In each pixel area PXA of the circuit layer PCL, circuit elements (e.g., transistors TR and a storage capacitor Cst) for forming the pixel circuit PXC of the corresponding pixel PXL and various lines electrically connected to the circuit elements may be disposed. In each pixel area PXA of the display layer DPL, first and second electrodes ELT1 and ELT2, light emitting elements LD, and/or first and second contact electrodes CNE1 and CNE2 which form a light emitting unit EMU of the corresponding pixel PXL may be disposed.

The circuit layer PCL may include insulating layers, as well as the circuit elements and the lines. For example, the circuit layer PCL may include a buffer layer BFL, a gate insulating layer GI, a first interlayer insulating layer ILD1, a second interlayer insulating layer ILD2, and/or a passivation layer PSV, which are successively or sequentially stacked on the surface of the base layer BSL.

Furthermore, the circuit layer PCL may selectively further include a first conductive layer including at least one light shielding layer disposed under at least some transistors TR (or including back gate electrodes BGE of the transistors TR).

The buffer layer BFL may be disposed on the surface of the base layer BSL including the first conductive layer. The buffer layer BFL may prevent impurities from diffusing into each circuit element.

A semiconductor layer may be disposed on the buffer layer BFL. For example, the semiconductor layer may include a semiconductor pattern SCP of each transistor TR. The semiconductor pattern SCP may include a channel area which overlaps the gate electrode GE, and first and second conductive areas (e.g., source and drain areas) disposed on opposite sides of the channel area.

The semiconductor pattern SCP may be a semiconductor pattern formed of polysilicon, amorphous silicon, an oxide semiconductor, or the like. Furthermore, the channel area of the semiconductor pattern SCP may be an intrinsic semiconductor, which is an undoped semiconductor pattern. Each of the first and second conductive areas of the semiconductor pattern SCP may be a semiconductor pattern doped with a predetermined impurity.

In an embodiment, the semiconductor patterns SCP of the transistors TR that form each pixel circuit PXC may be formed of substantially the same or similar material. For example, the semiconductor patterns SCP of the transistors TR may be formed of an identical material among polysilicon, amorphous silicon, and an oxide semiconductor.

In an embodiment, some of the transistors TR and the other transistors may include semiconductor patterns SCP formed of different materials. For example, the semiconductor patterns SCP of some of the transistors TR may be formed of polysilicon or amorphous silicon, and the semiconductor patterns SCP of the other transistors TR may be formed of an oxide semiconductor.

The gate insulating layer GI may be disposed on the semiconductor layer. A second conductive layer may be disposed on the gate insulating layer GI.

The second conductive layer may include the gate electrode GE of each transistor TR. Furthermore, the second conductive layer may further include an electrode of the storage capacitor Cst and/or a predetermined line.

The first interlayer insulating layer ILD1 may be disposed on the second conductive layer. A third conductive layer may be disposed on the first interlayer insulating layer ILD1.

The third conductive layer may include the first and second transistor electrodes TE1 and TE2 of each transistor TR. Here, the first and second transistor electrodes TE1 and TE2 may be source and drain electrodes. Furthermore, the third conductive layer may further include an electrode of the storage capacitor Cst and/or a predetermined line.

The second interlayer insulating layer ILD2 may be disposed on the third conductive layer. A fourth conductive layer may be disposed on the second interlayer insulating layer ILD2.

Each of the buffer layer BFL, the gate insulating layer GI, the first interlayer insulating layer ILD1, and the second interlayer insulating layer ILD2 may be formed of a single layer or multiple layers and include at least one inorganic insulating material and/or organic insulating material. For example, each of the buffer layer BFL, the gate insulating layer GI, the first interlayer insulating layer ILD1, and the second interlayer insulating layer ILD2 may include various kinds of organic/inorganic material including silicon nitride ($SiN_x$), silicon oxide ($SiO_x$), or silicon oxynitride ($SiO_xN_y$).

The fourth conductive layer may include a bride pattern BRP which electrically connects the circuit layer PCL with the display layer DPL, and/or a predetermined line (e.g., the first power line PL1 and/or the second power line PL2). The bridge pattern BRP may be electrically connected to the first electrode ELT1 of each light emitting unit EMU through the first contact hole CH1 or the like. The second power line PL2 may be electrically connected to the second electrode ELT2 of each light emitting unit EMU through the second contact hole CH2 or the like.

Each conductive pattern, each electrode, and/or each line forming the first to fourth conductive layers may include at least one conductive material and thus have conductivity, and the material thereof is not particularly limited. For example, each conductive pattern, each electrode, and/or each line forming the first to fourth conductive layers may include at least one selected from among molybdenum (Mo), aluminum (Al), platinum (Pt), palladium (Pd), silver (Ag), magnesium (Mg), gold (Au), nickel (Ni), neodymium (Nd), iridium (Ir), chromium (Cr), titanium (Ti), tantalum (Ta), tungsten (W), and copper (Cu), but the disclosure is not limited thereto.

The passivation layer PSV may be disposed on the fourth conductive layer. In an embodiment, the passivation layer PSV may include at least an organic insulating layer and planarize the surface of the circuit layer PCL. The display layer DPL may be disposed on the passivation layer PSV.

The passivation layer PSV may be formed of a single layer or multiple layers and include at least one inorganic insulating material and/or organic insulating material. For example, the passivation layer PSV may include at least one organic insulating layer and planarize the surface of the circuit layer PCL. In an embodiment, the organic insulating layer may include at least one of acrylic resin, polyacrylate resin, epoxy resin, phenolic resin, polyamide resin, polyimide rein, unsaturated polyester resin, poly-phenylen ether resin, poly-phenylene sulfide resin, and benzocyclobutene resin, but the disclosure is not limited thereto.

The display layer DPL may include a light emitting unit EMU of each pixel PXL. For example, the display layer LDL may include the first and second electrodes ELT1 and ELT2 disposed in the emission area EMA of each pixel PXL, light emitting elements LD disposed between the first and second electrodes ELT1 and ELT2, and the first and second contact electrodes CNE1 and CNE2 electrically connecting the first and second electrodes ELT1 and ELT2 with the light emitting elements LD.

Although FIGS. 7A and 7B each illustrate a light emitting element LD, each pixel PXL may include light emitting elements LD electrically connected between the first and second electrodes ELT1 and ELT2 in the forward direction, as illustrated in the embodiments of FIGS. 5 to 6B. Therefore, in the description of the embodiments of FIGS. 7A and 7B and the other embodiments described below, each embodiment will be described on the assumption that the pixel PXL includes light emitting elements LD. Here, it is noted that in some embodiments, the pixel PXL may include only a single light emitting element LD.

Furthermore, the display layer DPL may further include a first bank BNK1 configured to protrude upward in an area of each of the first and second electrodes ELT1 and ELT2, and a second bank BNK2 enclosing each emission area EMA. For example, the display layer DPL may further include at least one conductive layer and/or insulating layer.

For example, the display layer DPL may include a first bank BNK1, first and second electrodes ELT1 and ELT2, a first insulating layer INS1, light emitting elements LD, an insulating pattern INP, first and second contact electrodes CNE1 and CNE2, and a third insulating layer INS3 successively or sequentially disposed and/or formed on the circuit layer PCL.

In an embodiment, the first and second contact electrodes CNE1 and CNE2 may be disposed on the same layer, as illustrated in FIG. 7A. In an embodiment, the first and second contact electrodes CNE1 and CNE21 may be separated from each other on different layers, as illustrated in FIG. 7B. In this case, the display layer DPL may further include a second insulating layer INS2 interposed between the first and second contact electrodes CNE1 and CNE2. For example, the second insulating layer INS2 may overlap the first contact electrode CNE1, and an end of the second insulating layer INS2 may be interposed between the first contact electrode CNE1 and the second contact electrode CNE2.

The position of the second bank BNK2 in a cross-sectional view may be changed according to embodiments. In an embodiment, the second bank BNK2 may be formed on the first insulating layer INS1. In an embodiment, the second bank BNK2 and the first bank BNK1 may be formed on the same layer. Furthermore, the second bank BNK2 may overlap or may not overlap the first bank BNK1.

The first bank BNK1 may be disposed on a surface of the base layer BSL on which the circuit layer PCL is selectively formed. The first bank BNK1 may be formed in a separate or integral pattern. The first bank BNK1 may protrude upward from the surface of the base layer BSL on which the circuit layer PCL is formed. Therefore, an area of each of the first and second electrodes ELT1 and ELT2 disposed on the first bank BNK1 may protrude upward.

The first bank BNK1 may include insulating material including at least one inorganic material and/or organic material. For example, the first bank BNK1 may include at least one inorganic layer including various inorganic insulating materials such as silicon nitride ($SiN_x$), silicon oxide ($SiO_x$), and silicon oxynitride ($SiO_xN_y$). As another example, the first bank BNK1 may include at least one organic layer including various kinds of organic insulating material or may be formed of a single-layered or multi-layered insulating body including a combination of organic material and inorganic material.

A reflective partition wall may be formed around the light emitting elements LD by the first bank BNK1 and the first and second electrodes ELT1 and ELT2 disposed on the first bank BNK1. For example, in the case where each of the first and second electrodes ELT1 and ELT2 may include a reflective electrode layer, light emitted from the opposite ends of the light emitting elements LD may be reflected by the reflective electrode layer and emitted upward from each pixel PXL.

The first bank BNK1 may have various shapes. In an embodiment, the first bank BNK1 may have an inclined surface which is inclined at an angle within a predetermined range with respect to the base layer BSL, as illustrated in FIGS. 7A and 7B. In an embodiment, the first bank BNK1 may have sidewalls each having a curved surface or a stepped shape. For example, the first bank BNK1 may have a semi-circular or semi-elliptical cross-section.

The first and second electrodes ELT1 and ELT2 that form the pixel electrodes of each pixel PXL may be disposed on the first bank BNK1. In an embodiment, each of the first and second electrodes ELT1 and ELT2 may have a shape corresponding to that of the first bank BNK1. For example, the first and second electrodes ELT1 and ELT2 may protrude upward (or in a height-wise direction of the base layer BSL) by the first bank BNK1.

Each of the first and second electrodes ELT1 and ELT21 may include at least one conductive material. For example, the first and second electrodes ELT1 and ELT2 may include at least one conductive material among at least one metal of various metal materials including silver (Ag), magnesium (Mg), aluminum (Al), platinum (Pt), palladium (Pd), gold (Au), nickel (Ni), neodymium (Nd), iridium (Ir), chromium (Cr), titanium (Ti), molybdenum (Mo), copper (Cu), or the like, or an alloy thereof, a conductive oxide such as indium tin oxide (ITO), indium zinc oxide (IZO), indium tin zinc oxide (ITZO), zinc oxide (ZnO), aluminum doped zinc oxide (AZO), gallium doped zinc oxide (GZO), zinc tin oxide (ZTO), gallium tin oxide (GTO), and fluorine doped tin oxide (FTO), and a conductive polymer such as PEDOT, but the disclosure is not limited thereto. For example, the first and second electrodes ELT1 and ELT2 may include other conductive materials such as a carbon nanotube and a graphene. In other words, the first and second electrodes ELT1 and ELT2 may include at least one of various conductive materials and thus have conductivity, and the material of the first and second electrodes ELT1 and ELT2 is not particularly limited. Furthermore, the first and second electrodes ELT1 and ELT2 may have the same or different conductive materials.

Each of the first and second electrodes ELT1 and ELT2 may have a single-layer or multi-layer structure. For example, the first and second electrodes ELT1 and ELT2 may include a reflective electrode layer including reflective conductive material (e.g., metal). Each of the first and second electrodes ELT1 and ELT2 may selectively further include at least one of at least one transparent electrode layer disposed on and/or under the reflective electrode layer, and at least one conductive capping layer covering or overlapping an upper portion of the reflective electrode layer and/or the transparent electrode layer.

The first insulating layer INS1 may be disposed in an area of each of the first and second electrode ELT1 and ELT2. For example, the first insulating layer INS1 may overlap an area of each of the first and second electrodes ELT1 and ELT2 and may include an opening to expose another area of each of the first and second electrodes ELT1 and ELT2. For example, the first insulating layer INS1 may include openings formed in an upper surface of the first bank BNK1. In an embodiment, the first insulating layer INS1 may include contact holes formed in respective connection points for electrically connecting the first and second electrodes ELT1 and ELT2 with the respective first and second contact electrodes CNE1 and CNE2.

The first insulating layer INS1 may be formed of a single layer or multiple layers and include at least one inorganic insulating material and/or organic insulating material. In an embodiment, the first insulating layer INS1 may include at least one inorganic layer including at least one of inorganic insulating material such as silicon nitride ($SiN_x$), silicon oxide ($SiO_x$), and silicon oxynitride ($SiO_xN_y$).

The first and second electrodes ELT1 and ELT2 may be respectively electrically connected to the first and second contact electrodes CNE1 and CNE2 in an open area of the first insulating layer INS1. In an embodiment, the first insulating layer INS1 may be omitted. In this case, the light emitting elements LD may be directly disposed on the passivation layer PSV and/or an end of each of the first and second electrodes ELT1 and ELT2.

In an embodiment, the first insulating layer INS1 may be primarily formed to overlap the overall surfaces of the first and second electrodes ELT1 and ELT2. After the light emitting elements LD are supplied onto and aligned on the first insulating layer INS1, the first insulating layer INS1 may be partially opened to expose an area of each of the first and second electrodes ELT1 and ELT2. After the first and second electrodes ELT1 and ELT2 have been formed, the first and second electrodes ELT1 and ELT2 may be overlapped by the first insulating layer INS1 and thus can be prevented from being damaged during a subsequent process.

The light emitting elements LD may be supplied onto and aligned on the emission area EMA in which the first insulating layer INS1 and other layers are formed. Before the supply of the light emitting elements LD, the second bank BNK2 may be formed around the emission area EMA. For example, the second bank BNK2 may be formed in the display area DA to enclose each emission area EMA.

In an embodiment, at least some of the light emitting elements LD may be disposed between a pair of first and second electrodes ELT1 and ELT2 adjacent thereto in the horizontal or diagonal direction such that the opposite ends (for example, the first and second ends EP1 and EP2) of each of the least some light emitting elements LD in the longitudinal direction overlap the pair of first and second electrodes ELT1 and ELT2. In an embodiment, at least some of the light emitting elements LD may be disposed between a pair of first and second electrodes ELT1 and ELT2 adjacent thereto such that the at least some light emitting elements LD do not overlap the first and/or second electrode ELT1 and/or ELT2 and may be electrically connected to the pair of first and second electrodes ELT1 and ELT2 respectively through the first and second contact electrodes CNE1 and CNE2. In other words, in an embodiment, the light emitting elements LD may or may not overlap the first and/or second electrode ELT1 and/or ELT2 and may be electrically connected between the first and second electrodes ELT1 and ELT2 by the first and second contact electrodes CNE1 and CNE2.

The insulating pattern INP may be disposed in an area of each of the light emitting element LD. For example, the insulating pattern INP may be disposed in the area of the light emitting element LD such that the first and second ends of each of the light emitting elements LD are exposed. For example, the insulating pattern INP may be partially disposed only over an area including a central area of each of the light emitting elements LD. Although the insulating pattern INP is formed in an independent pattern in the emission area EMA of each pixel PXL, the disclosure is not limited thereto.

The insulating pattern INP may be formed of a single layer or multiple layers and include at least one inorganic insulating material and/or organic insulating material. For example, the insulating pattern INP may include various kinds of organic/inorganic insulating materials including silicon nitride ($SiN_x$), silicon oxide ($SiO_x$), silicon oxynitride ($SiO_xN_y$), aluminum oxide ($Al_2O_3$), photoresist (PR) material, or the like.

After the alignment of the light emitting elements LD has been completed, the insulating pattern INP may be formed on the light emitting elements LD so that the light emitting elements LD may be prevented from being removed from the aligned position.

In an embodiment, in the case where space is present between the first insulating layer INS1 and the light emitting elements LD due to a step difference or height difference formed by the first and second electrodes ELT1 and ELT2, the space may be filled with insulating material supplied during a process of forming the insulating pattern INP. Therefore, the light emitting elements LD may be more stably supported. In some embodiments, the space may not be completely filled.

The opposite ends of the light emitting elements LD, for example, the first and second ends EP1 and EP2, which are not overlapped by the insulating pattern INP, may be respectively overlapped by the first and second contact electrodes CNE1 and CNE2. The first and second contact electrodes CNE2 and CNE2 may be spaced apart from each other. For example, the first and second contact electrodes CNE1 and CNE2 may be disposed at positions spaced apart from each other on the first and second ends EP1 and EP2 of at least one light emitting element LD with the insulating pattern INP interposed between the first and second contact electrodes CNE1 and CNE2.

Furthermore, the first and second contact electrodes CNE1 and CNE2 may be disposed on the first and second electrodes ELT1 and ELT2 to overlap respective exposed areas of the first and second electrodes ELT1 and ELT2. For example, the first and second contact electrode CNE1 and CNE2 may be disposed on at least one area of each of the first and second electrodes ELT1 and ELT2 such that the first and second contact electrodes CNE1 and CNE2 directly or indirectly contact each of the first and second electrodes ELT1 and ELT2 over or around the first bank BNK1.

Therefore, the first and second contact electrodes CNE1 and CNE2 may be electrically connected to the first and second electrodes ELT1 and ELT2, respectively. The first and second electrodes ELT1 and ELT2 may be respectively electrically connected to the first and second ends EP1 and EP2 of at least one adjacent light emitting element LD through the first and second contact electrodes CNE1 and CNE2.

In the case where the first and second contact electrodes CNE1 and CNE2 are formed on the same layer as described with reference to the embodiment of FIG. 7A, the first and second contact electrodes CNE1 and CNE2 may be simultaneously formed by the same process or may be successively or sequentially formed, and the second insulating layer INS2 may be omitted. In this case, a process of fabricating the pixel PXL and the display device including the pixel PXL may be simplified.

In case that the first and second contact electrodes CNE1 and CNE2 are formed on different layers on a surface of the base layer BSL as described with reference to the embodiment of FIG. 7B, the first and second contact electrodes CNE1 and CNE2 may be more reliably separated from each other.

The second insulating layer INS2 may overlap one of the first and second contact electrodes CNE1 and CNE2 (e.g., the first contact electrode CNE1). If the insulating pattern INP and/or the second insulating layer INS2 is formed over the light emitting elements LD, electrical stability between the first and second ends EP1 and EP2 of the light emitting elements LD may be secured. Therefore, a short-circuit defect between the first and second ends EP1 and EP2 of the light emitting elements LD may be prevented from occurring.

The second insulating layer INS2 may be formed of a single layer or multiple layers and include at least one inorganic insulating material and/or organic insulating material. In an embodiment, the second insulating layer INS2 may include at least one inorganic layer including at least one kind of inorganic insulating material such as silicon nitride (SiN$_x$), silicon oxide (SiO$_x$), and silicon oxynitride (SiO$_x$N$_y$).

The first and second contact electrodes CNE1 and CNE2 may be formed of various transparent conductive materials. For example, the first and second contact electrodes CNE1 and CNE2 may include at least one of various transparent conductive materials including ITO, IZO, ITZO, ZnO, AZO, GZO, ZTO, GTO, and FTO and may be substantially transparent or translucent to satisfy a predetermined transmittancy. Therefore, light emitted from the light emitting elements LD through the first and second ends EP1 and EP2 may be emitted from the display panel PNL through the first and second contact electrodes CNE1 and CNE2.

The third insulating layer INS3 may be disposed on the first and second contact electrodes CNE1 and CNE2. For example, the third insulating layer INS3 may be formed and/or disposed on the overall surface of the display area DA to cover or overlap the first and second banks BNK1 and BNK2, the first and second electrodes ELT1 and ELT2, the first and/or second insulating layer INS1 and/or INS2, the light emitting elements LD, the insulating pattern INP, and the first and second contact electrodes CNE1 and CNE2.

The third insulating layer INS3 may include at least one inorganic layer and/or organic layer. The third insulating layer INS3 may be formed of a single layer or multiple layers and include at least one inorganic insulating material and/or organic insulating material. For example, the third insulating layer INS3 may include various kinds of organic/inorganic insulating materials including silicon nitride (SiN$_x$), silicon oxide (SiO$_x$), silicon oxynitride (SiO$_x$N$_y$), aluminum oxide (Al$_2$O$_3$), or the like.

In an embodiment, the third insulating layer INS3 may include a thin-film encapsulation layer having a multi-layered structure. For example, the third insulating layer INS3 may be formed of a thin-film encapsulation layer having a multi-layered structure including at least two inorganic insulating layers, and at least one organic insulating layer interposed between the at least two inorganic insulating layers. Here, the material and/or structure of the third insulating layer INS3 may be changed in various ways. In some embodiments, at least one overcoat layer, at least one filler layer, and/or at least one upper substrate may be further disposed over or on the third insulating layer INS3.

Figure 8:
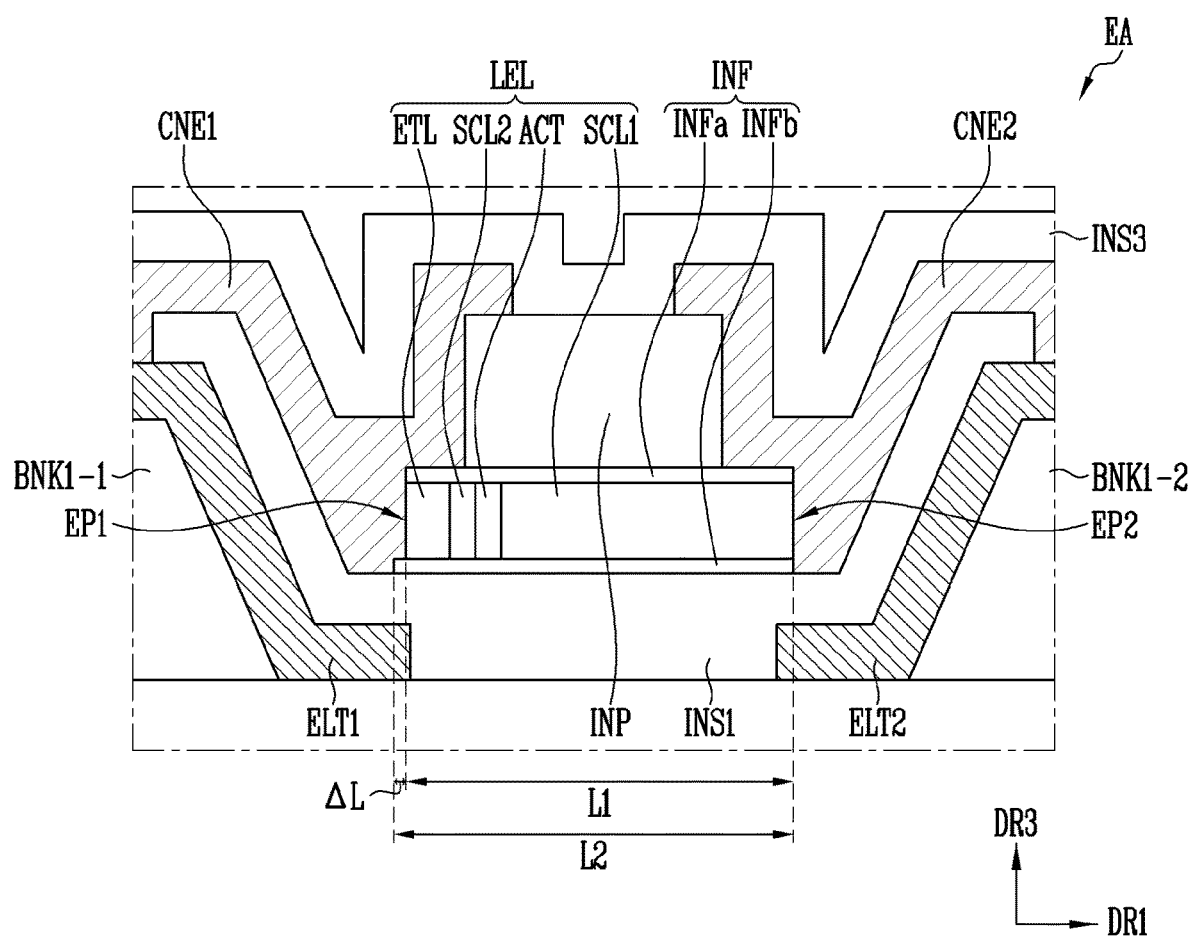
FIG. 8 is a schematic enlarged sectional view of area EA of FIG. 7A.
Figure 9A:
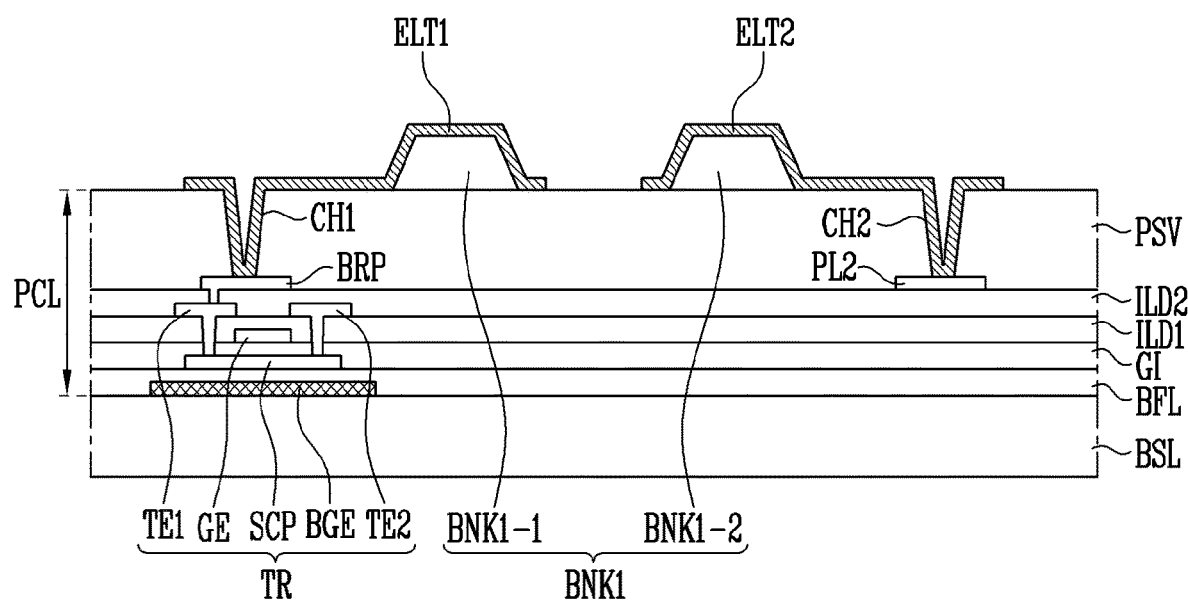
FIGS. 9A to 9F are schematic cross-sectional views sequentially illustrating a method of fabricating a display device in accordance with an embodiment of the disclosure.
Figure 9B:
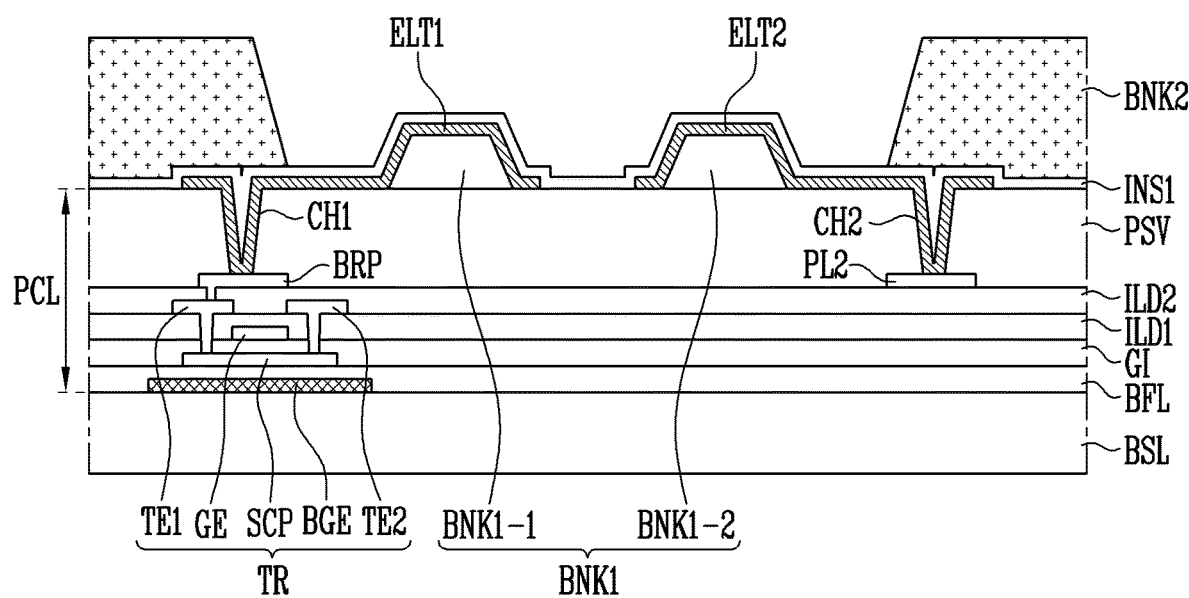
Figure 9C:
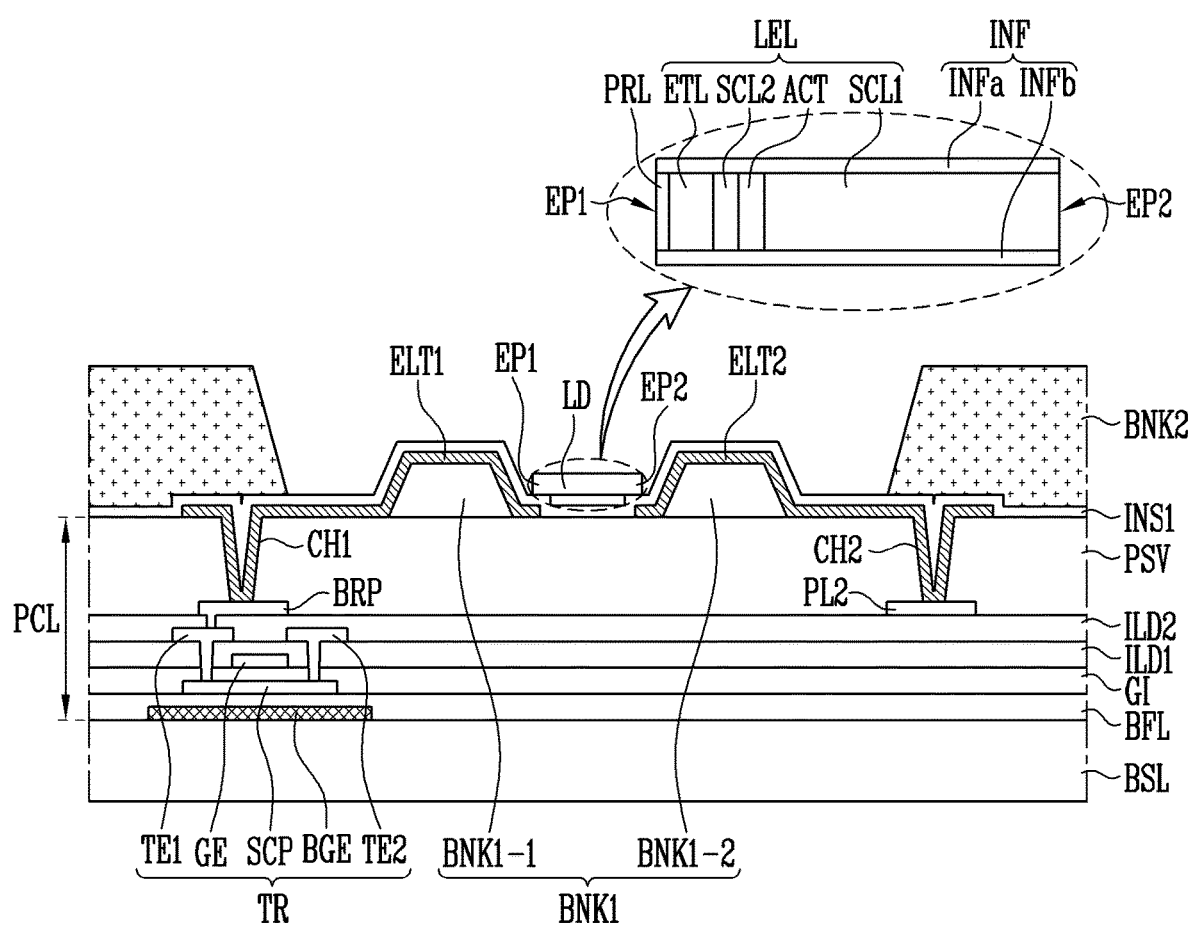
Figure 9D:
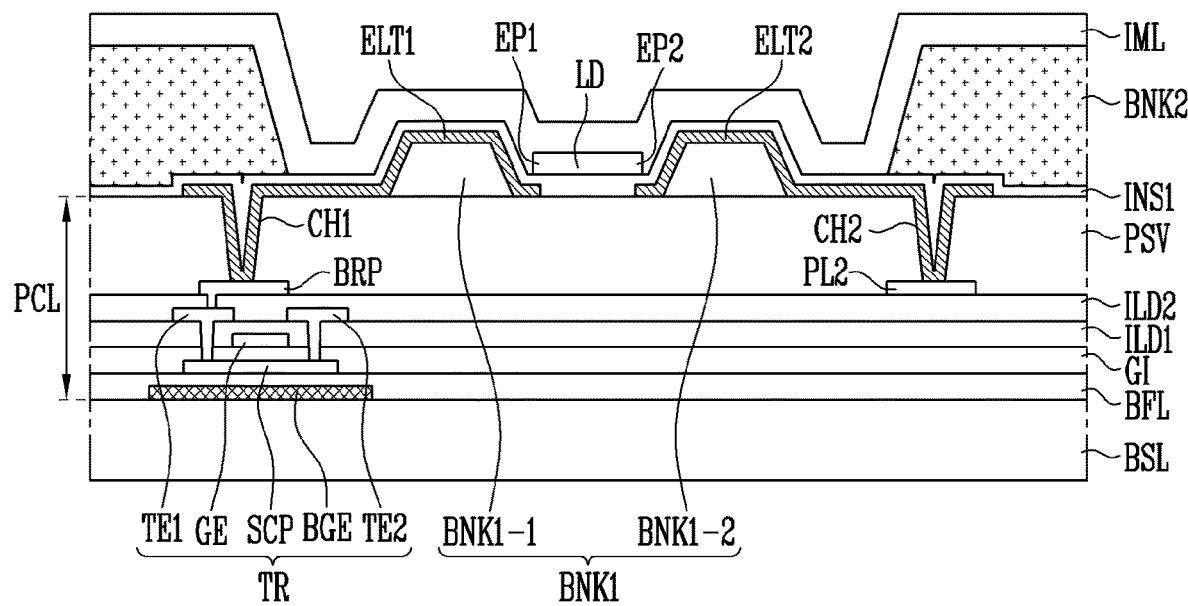
Figure 9E:
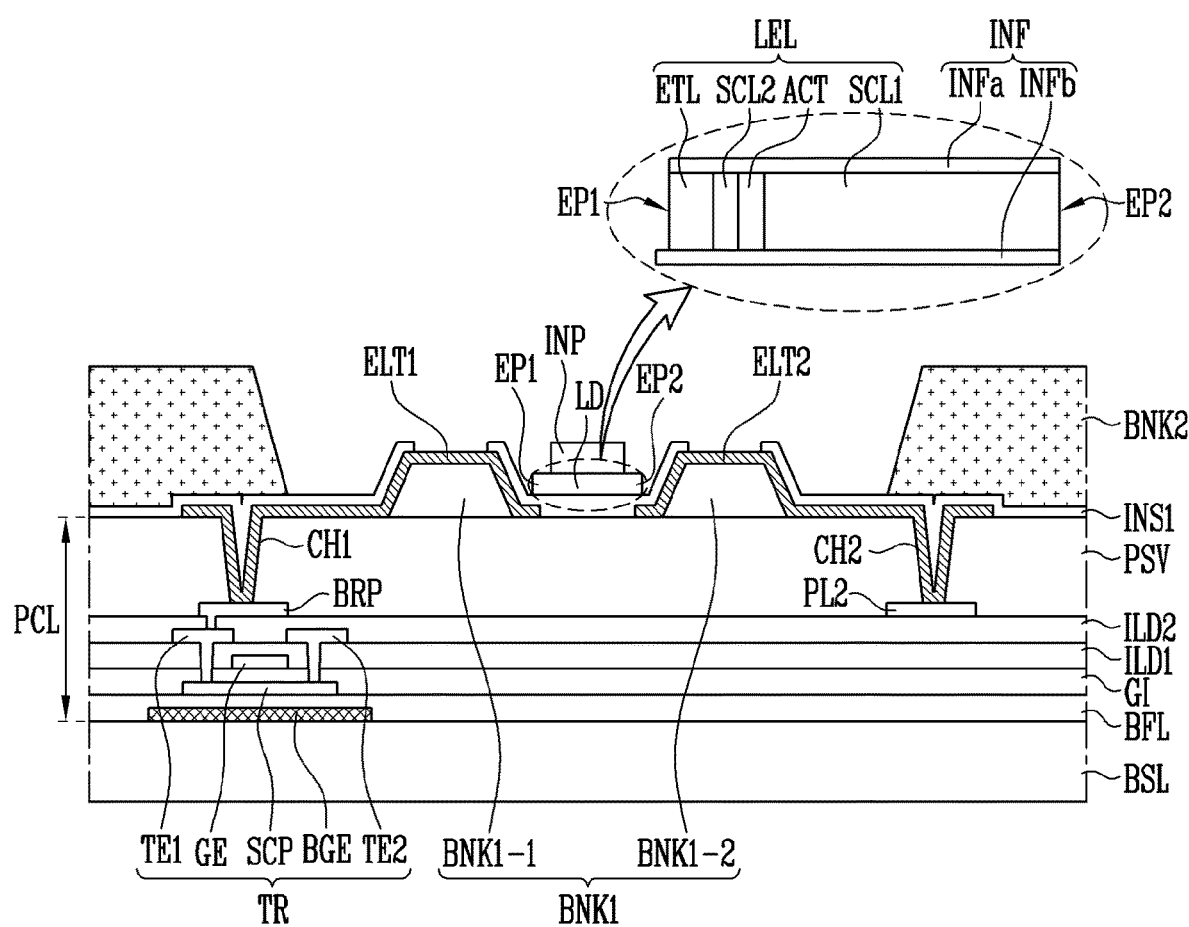
Figure 9F:
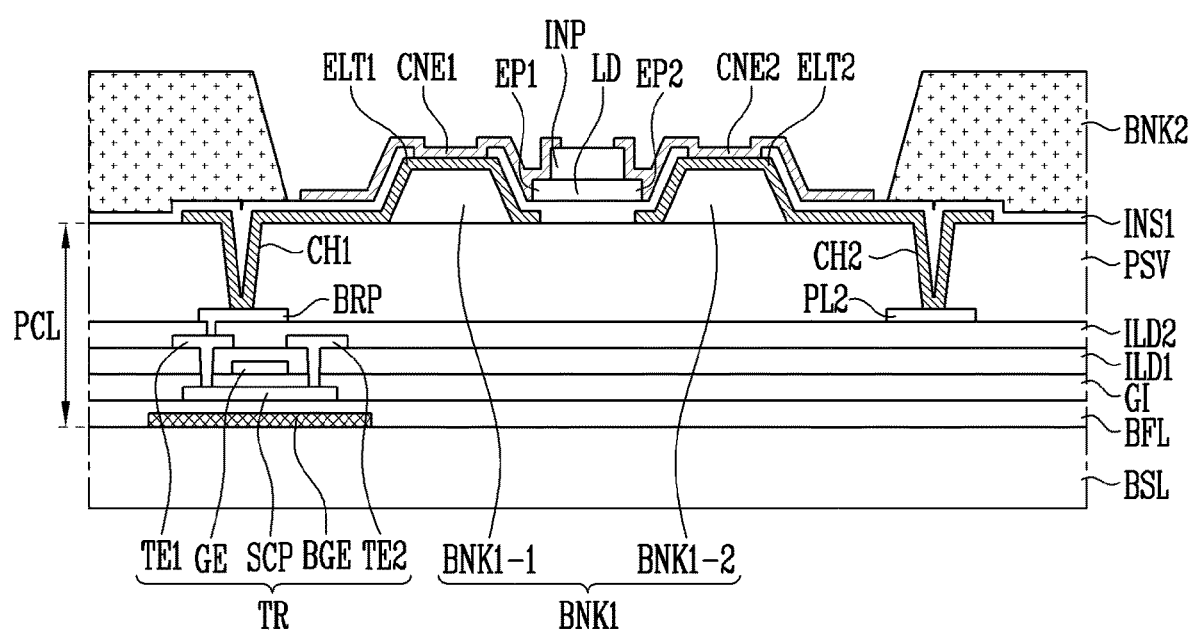

FIG. 8 is a schematic enlarged sectional view of area EA of FIG. 7A. For example, as described with reference to in the embodiments of FIGS. 1, 2A, and 2B, FIG. 8 illustrates an embodiment where a light emitting unit EMU of the pixel PXL is formed on an electrode layer ETL by connecting at least one light emitting element LD including a protective layer PRL between first and second electrodes ELT1 and ELT2 and where a light emitting element LD, and electrodes and insulating layers are disposed around the light emitting element LD. During a process of fabricating the pixel PXL according to the embodiment of FIG. 8, the protective layer PRL of the light emitting element LD may be removed, so that the pixel PXL may not include the protective layer PRL, as illustrated in FIG. 8.

Referring to FIGS. 1 to 8, the light emitting element LD may include a light emitting stack LEL including a first semiconductor layer SCL1, an active layer ACT, a second semiconductor layer SCL2, and an electrode layer ETL that are successively disposed in a direction from the second end EP2 to the first end EP1. Furthermore, the light emitting element LD may include an insulating film INF configured to enclose an outer circumferential surface (e.g., a sidewall of a cylinder) of the light emitting stack LEL.

The insulating film INF may be formed to expose the opposite ends of the light emitting element LD. For example, the insulating film INF may expose the electrode layer ETL and a surface of the first semiconductor layer SCL1, respectively, on the first end EP1 and the second end EP2 of the light emitting element LD.

In an embodiment, in the case where the light emitting element LD is arranged between the first electrode ELT1 and the second electrode ELT2 in the horizontal direction, e.g., in the first direction DR1 and the insulating pattern INP is disposed in an area of the light emitting element LD, the insulating film INF of the light emitting element LD may include an upper surface INFa (or an upper area) and a lower surface INFb (or a lower area) that face each other in a third direction DR3 (e.g., a height- or thickness-wise direction of the pixel PXL or the display panel PNL). The upper surface INFa of the insulating film may contact the insulating pattern INP, and the lower surface INFb of the insulating film may contact the first insulating layer INS1.

In an embodiment, the pixel PXL may be formed by using at least one light emitting element LD including the protective layer PRL on the electrode layer ETL, as illustrated in FIGS. 1, 2A, and 2B. For example, the protective layer PRL may be removed during the process of forming the insulating pattern INP. Here, the electrode layer ETL may be exposed at the first end EP1 of the light emitting element LD, whereby the first contact electrode CNE1 may directly contact a surface of the electrode layer ETL. Therefore, the electrode layer ETL may be electrically connected to the first contact electrode CNE1, and the second semiconductor layer SCL2 may be connected to the first electrode ELT1 through the electrode layer ETL and the first contact electrode CNE1. In the case where the electrode layer ETL is disposed on the first end EP1 of the light emitting element LD, the second semiconductor layer SCL2 may be reliably connected to the first electrode ELT1.

If the protective layer PRL is removed during the process of forming the insulating pattern INP after the light emitting element LD including the protective layer PRL is supplied onto and aligned on the electrode layer ETL in each emission area EMA in which the first and second electrodes ELT1 and ELT2 are formed, damage to the electrode layer ETL may be prevented or reduced during the process of fabricating the light emitting element LD and/or the pixel PXL. For example, as illustrated in FIGS. 3G and 3H, during a process of etching the insulating film INF over the light emitting element LD in the thickness-wise direction, the protective layer PRL may be disposed on the electrode layer ETL, and thus the electrode layer ETL may be prevented from being damaged. Therefore, loss in the thickness and/or surface area of the electrode layer ETL may be prevented, and the surface of the electrode layer ETL can be prevented from being damaged and roughened. If damage to the electrode layer ETL is prevented or reduced, the light emitting element LD may be reliably connected to the first electrode ELT1, so that electrical characteristics may be improved.

As illustrated in FIGS. 3G and 3H, in case that the light emitting element LD is fabricated such that the protective layer PRL is formed on the electrode layer ETL, damage to the insulating film INF may be prevented or reduced in an area enclosing the light emitting stack LEL, even if the insulating film INF is over-etched during the process of etching the insulating film INF and thus the insulating film INF is partially damaged in an area enclosing an outer circumferential surface of the protective layer PRL. Therefore, a short-circuit defect through the light emitting element LD due to damage to the insulating film INF may be prevented or reduced. For example, if the insulating film INF stably encloses the light emitting stack LEL in an area other than the first and second ends EP1 and EP2 of the light emitting element LD, a short-circuit defect may be prevented from occurring in the light emitting element LD, e.g., during a process of forming the first and second contact electrodes CNE1 and CNE2.

During a process of forming the insulating pattern INP over the light emitting element LD, at least one end of the insulating film INF may be etched along with the protective layer PRL. For example, on the first end EP1 of the light emitting element LD, an end of the upper surface INFa of the insulating film INF (e.g., the area that has been disposed on the protective layer PRL) may be etched. In an embodiment, conditions for etching the insulating pattern INP may be controlled to prevent the electrodes and/or the insulating layers that are formed under the light emitting element LD from being damaged, so that the lower surface INFb of the insulating film may not be etched, or the amount with which the lower surface INFb is etched is insignificant compared to that of the upper surface INFa.

In this case, the insulating film INF may have an asymmetric structure having different lengths or widths on the upper surface INFa and the lower surface INFb. For example, the lower surface INFb of the insulating film INF may protrude outward from the electrode layer ETL at the first end EP1 of the light emitting element LD.

For example, the lower surface INFb of the insulating film INF may protrude outward from the electrode layer ETL by a length (ΔL) corresponding to the thickness TH1 (refer to FIG. 2A) of the protective layer PRL. In an embodiment, in the case where the protective layer PRL has the thickness TH1 equal to or less than the thickness TH2 (refer to FIG. 2A) of the insulating film INF, the lower surface INFb of the insulating film INF may protrude outward from the electrode layer ETL by a length (ΔL) equal to or less than the thickness TH2 of the insulating film INF. Therefore, the lower surface INFb of the insulating film INF may have a length L2 (or width) greater than a length L1 of the upper surface INFa in a longitudinal direction (e.g., in the first direction DR1) of the light emitting stack LEL extending from the first end EP1 to the second end EP2 of the light emitting element LD.

Although not illustrated in FIG. 8, the upper surface INFa of the insulating film INF may be partially etched on the second end EP2 of the light emitting element LD. However, since the first semiconductor layer SCL1 having a greater length (or thickness) is disposed on the second end EP2 of the light emitting element LD, the first semiconductor layer SCL1 may be reliably connected to the second contact electrode CNE2 without a problem such as a short-circuit defect. The second contact electrode CNE2 may directly contact a surface of the first semiconductor layer SCL1 on the second end EP2 of the light emitting element LD. Therefore, the first semiconductor layer SCL1 may be electrically connected to the second contact electrode CNE2 and to the second electrode ELT2 through the second contact electrode CNE2. In an embodiment, an additional electrode layer may be further disposed on the second end EP2 of the light emitting element LD.

FIGS. 9A to 9F are schematic sectional views sequentially illustrating a method of fabricating a display device in accordance with an embodiment. For example, FIGS. 9A to 9F illustrates a method of fabricating the display device including the pixel PXL of FIG. 7A and, particularly, illustrates different stages of a method of forming the display layer DPL of the pixel PXL.

As described with referent to the embodiments of FIGS. 1, 2A, and 2B, the light emitting unit EMU of the pixel PXL may be formed by using at least one light emitting element LD including the protective layer PRL on the electrode layer ETL. In this case, the step of preparing the light emitting elements LD may be performed before a process of fabricating the pixel PXL.

For example, as illustrated in the embodiment of FIGS. 3A to 3I, at least one light emitting LD (e.g., light emitting elements LD) may be fabricated. Furthermore, to supply the light emitting elements LD to each emission area EMA by an inkjet method or the like, the step of forming light emitting element ink by mixing the light emitting elements LD with a fluidic solution (or solvent) may be performed.

Referring to FIGS. 1 to 9A, the first electrode ELT1 and the second electrode ELT2 may be formed on a surface of the base layer BSL on which the pixel circuit layer PCL and/or the first bank BNK1 is selectively formed. The first and second electrodes ELT1 and ELT2 may be formed using at least one conductive material and may be formed by a conductive layer deposition process and/or a conductive layer patterning process. The material of forming the first and second electrodes ELT1 and ELT2 and/or a process method to be applied thereto is not particularly limited.

Referring to FIGS. 1 to 9B, the first insulating layer INS1 and the second bank BNK2 may be formed on the surface of the base layer BSL including the first and second electrodes ELT1 and ELT2. If the second bank BNK2 is formed, each emission area EMA to which the light emitting element ink is to be supplied may be defined. Each of the first insulating layer INS1 and the second bank BNK2 may be formed using at least one insulating material and may be formed through an insulating layer deposition process and/or an insulating layer patterning process. The material of forming the first insulating layer INS1 and the second bank BNK2 and/or a process method to be applied thereto is not particularly limited.

Referring to FIGS. 1 to 9C, the light emitting elements LD may be supplied onto a surface of the base layer BSL including the first and second electrodes ELT1 and ELT2, the first insulating layer INS1, and the second bank BNK2. The light emitting element LD may be aligned between the first and second electrodes ELT1 and ELT2. For example, as illustrated in the embodiments of FIGS. 1, 2A, and 2B, the light emitting element ink mixed with light emitting elements LD including the protective layer PRL may be dropped onto or applied to each emission area EMA defined by the second bank BNK2, and then predetermined alignment signals may be applied to the first and second electrodes ELT1 and ELT2 (or alignment lines before being divided into the first electrode ELT1 and the second electrode ELT2), and thus the light emitting elements LD may be aligned between the first and second electrodes ELT1 and ELT2 in the horizontal direction.

Referring to FIGS. 1 to 9D, an insulating layer IML may be formed on the surface of the base layer BSL including the light emitting element LD. The insulating layer IML may be formed of a signal layer or multiple layers including at least one insulating material. The material of forming the insulating layer IML and/or a process method to be applied thereto is not particularly limited. In an embodiment, the insulating layer IML may be formed of an inorganic insulating layer including silicon oxide ($SiO_x$), silicon nitride ($SiN_x$), or silicon oxynitride ($SiO_xN_y$), but the disclosure is not limited thereto.

In an embodiment, in the case where space is present between the first insulating layer INS1 and the light emitting elements LD due to a step difference or height difference formed by the first and second electrodes ELT1 and ELT2, the space may be at least partially filled with insulating material supplied during a process of forming the insulating layer IML.

Referring to FIGS. 1 to 9E, the insulating pattern INP may be formed in an area of the light emitting element LD by etching the insulating layer IML such that the first and second ends EP1 and EP2 of the light emitting element LD are exposed. A method of patterning the insulating pattern INP is not particularly limited. In an embodiment, the insulating pattern INP may be patterned by a dry etching method using predetermined etching gas (e.g., $CF_4$ gas).

The protective layer PRL formed on the first end EP1 of the light emitting element LD and an end of the insulating film INF disposed on the protective layer PRL (and/or the other end of the insulating film INF disposed on the first semiconductor layer SCL1) may be etched along with the insulating layer IML during the process of forming the insulating pattern INP. For example, the protective layer PRL may be formed of a thin film by using material having a high etch rate so that the protective layer PRL may be readily removed in the step of etching the insulating layer IML. For example, the protective layer PRL may have an etch rate equal to or higher than that of the insulating film INF and may have a thickness equal to or less than that of the insulating film INF. Therefore, in the step of forming the insulating pattern INP, the protective layer PRL may be completely removed such that the electrode layer ETL is exposed on the first end EP1 of the light emitting element LD.

The electrode layer ETL may be protected by the protective layer PRL during the process of fabricating the light emitting element LD (e.g., during the process of etching the insulating film INF) and the process of forming the insulating pattern INP, so that the electrode layer ETL may be prevented from being damaged. Therefore, a remnant of the insulating layer IML may be prevented from remaining on the electrode layer ETL. Therefore, during a subsequent process, the electrode layer ETL may be reliably connected to the first contact electrode CNE1, and electrical characteristics between the electrode layer ETL and the first contact electrode CNE1 may be improved.

Furthermore, the protective layer PRL and the insulating film INF provided thereon may prevent or reduce damage to the insulating film INF in the area enclosing the light emitting stack LEL during the process of fabricating the light emitting element LD and the pixel PXL. Therefore, a short-circuit defect through the light emitting element LD may be prevented.

In an embodiment, during the process of forming the insulating pattern INP by etching the insulating layer IML and/or a subsequent process, the first insulating layer INS1 may be etched such that an area of each of the first and second electrodes ELT1 and ELT2 is exposed. For example, the first insulating layer INS1 may be etched over the first bank BNK1 such that an area of each of the first and second electrodes ELT1 and ELT2 is exposed.

Referring to FIGS. 1 to 9F, the first and second ends EP1 and EP2 of the light emitting element LD may be respectively connected to the first and second electrodes ELT1 and ELT2 by respectively forming the first and second contact electrodes CNE1 and CNE2 on the first and second ends EP1 and EP2 of the light emitting element LD. For example, the first contact electrode CNE1 may be formed on the first end EP1 of the light emitting element LD such that the first contact electrode CNE1 contacts the electrode layer ETL.

The second contact electrode CNE2 may be formed on the second end EP2 of the light emitting element LD such that the second contact electrode CNE2 contacts the first semiconductor layer SCL1. The first and second contact electrodes CNE1 and CNE2 may be respectively formed on the first and second electrodes ELT1 and ELT2 such that the first and second contact electrodes CNE1 and CNE2 contact the first and second electrodes ELT1 and ELT2, e.g., over the first bank BNK1. Therefore, the first and second contact electrodes CNE1 and CNE2 may be electrically connected to the first and second electrodes ELT1 and ELT2.

The first and second contact electrodes CNE1 and CNE2 may be formed using at least one conductive material and may be formed by a conductive layer deposition process and/or a conductive layer patterning process. The material of forming the first and second contact electrodes CNE1 and CNE2 and/or a process method to be applied thereto is not particularly limited. In an embodiment, the first and second contact electrodes CNE1 and CNE2 may be formed using transparent conductive material, so that light generated from the light emitting element LD may pass through the first and second contact electrodes CNE1 and CNE2.

Thereafter, the third insulating layer INS3 may be formed on the surface of the base layer BSL including the first and second contact electrodes CNE1 and CNE2, etc. As a result, the pixel PXL illustrated in FIG. 7A and the display device including the pixel PXL may be fabricated. For example, the third insulating layer INS3 may be formed on the surface of the base layer BSL to seal the display area DA.

In accordance with embodiments of the disclosure, a protective layer may be formed on an electrode layer of a light emitting element, and thus damage to the electrode layer and an insulating film enclosing the electrode layer may be prevented or reduced during a process of fabricating the light emitting element and a display device using the light emitting element. Therefore, the light emitting element may be reliably connected between a first electrode and a second electrode of each pixel. Furthermore, since the insulating film enclosing a light emitting stack of the light emitting element is prevented from being damaged, a short-circuit defect through the light emitting element can be prevented from occurring.

In accordance with embodiments of the disclosure, during a process of fabricating the display device by using the light emitting element including the protective layer, the protective layer can be readily removed without using an additional process.

While the spirit and scope of the disclosure are described by detailed embodiments, it should be noted that the above-described embodiments are merely descriptive and should not be considered limiting. It should be understood by those skilled in the art that various changes, substitutions, and alternations may be made herein without departing from the scope of the disclosure.

The scope of the claimed invention is not limited by detailed descriptions of the specification and should be defined by the accompanying claims. Furthermore, all changes or modifications of the disclosure derived from the meanings and scope of the claims, and equivalents thereof should be construed as being included in the scope of the disclosure.

What is claimed is:
1. A display device comprising:
   a pixel disposed in a display area, the pixel comprising:
      a first electrode; and
      a second electrode spaced apart from the first electrode;

a light emitting element including a first end adjacent to the first electrode, and a second end adjacent to the second electrode, and comprising:
  a light emitting stack including:
    a first semiconductor layer;
    an active layer;
    a second semiconductor layer; and
    an electrode layer, the first semiconductor layer, the active layer, the second semiconductor layer, and the electrode layer being successively disposed in a direction from the second end to the first end of the light emitting element;
  an insulating pattern disposed on a part of the light emitting element and exposing the first and the second ends of the light emitting element; and
  a first contact electrode and a second contact electrode electrically connecting the first and the second ends of the light emitting element to the first electrode and the second electrode, respectively, wherein
the light emitting element comprises an insulating film enclosing an outer circumferential surface of the light emitting stack and exposing a surface of the electrode layer and a surface of the first semiconductor layer respectively at the first and the second ends of the light emitting element, and
the insulating film has an asymmetric structure such that an upper surface of the insulating film contacting the insulating pattern and a lower surface of the insulating film opposite to the upper surface in another direction have different lengths, the lengths being defined in the direction, the another direction and the direction perpendicular to each other.

2. The display device according to claim 1, wherein the lower surface of the insulating film protrudes outward from the electrode layer at the first end of the light emitting element.

3. The display device according to claim 2, wherein the lower surface of the insulating film protrudes outward from the electrode layer at the first end of the light emitting element by a length equal to or less than a thickness of the insulating film.

4. The display device according to claim 1, wherein the lower surface of the insulating film has a length greater than a length of the upper surface of the insulating film in a longitudinal direction of the light emitting stack that extends from the first end to the second end of the light emitting element.

5. The display device according to claim 1, wherein
the first contact electrode directly contacts the surface of the electrode layer on the first end of the light emitting element, and
the second contact electrode directly contacts the surface of the first semiconductor layer on the second end of the light emitting element.

6. A method of fabricating a display device, comprising:
preparing a light emitting element including a first end and a second end and comprising:
  a first semiconductor layer;
  an active layer;
  a second semiconductor layer;
  an electrode layer;
  a protective layer, the first semiconductor layer, the active layer, the second semiconductor layer, the electrode layer, and the protective layer being successively disposed in a direction from the second end to the first end; and
  an insulating film enclosing outer circumferential surfaces of the first semiconductor layer, the active layer, the second semiconductor layer, and the electrode layer and exposing a surface of the first semiconductor layer and a surface of the protective layer;
forming a first electrode and a second electrode on a surface of a base layer;
supplying the light emitting element onto the surface of the base layer and aligning the light emitting element between the first and the second electrodes;
forming an insulating layer on the surface of the base layer;
forming an insulating pattern on a part of the light emitting element by etching the insulating layer, the insulating pattern exposing the first and the second ends of the light emitting element; and
electrically connecting the first and the second ends of the light emitting element to the first electrode and the second electrode, respectively,
wherein the forming of the insulating pattern comprises removing the protective layer such that the electrode layer is exposed at the first end of the light emitting element.

7. The method according to claim 6, wherein the preparing of the light emitting element comprises:
forming a light emitting stack by successively forming the first semiconductor layer, the active layer, the second semiconductor layer, and the electrode layer on a substrate;
forming a rod-type light emitting stack by etching the light emitting stack in a longitudinal direction of the light emitting element;
forming the protective layer on the rod-type light emitting stack;
forming the insulating film on surfaces of the rod-type light emitting stack and the protective layer;
etching the insulating film such that the protective layer is exposed; and
separating the light emitting element from the substrate.

8. The method according to claim 7, wherein the etching of the insulating film comprises etching the protective layer by a partial thickness such that the protective layer has a thickness equal to or less than a thickness of the insulating film.

9. The method according to claim 7, wherein the forming of the protective layer comprises forming the protective layer by using an insulating material having an etch rate equal to or greater than an etch rate of an insulating material for forming the insulating film.

10. The method according to claim 7, wherein
the forming of the insulating film comprising-comprises forming the insulating film by an atomic layer deposition process, and
the forming of the protective layer comprises forming the protective layer by using a material that is not deformed at temperatures of the atomic layer deposition process.

11. The method according to claim 7, wherein the forming of the protective layer comprises:
applying an organic photoresist material onto a surface of the substrate on which the rod-type light emitting stack is formed; and
forming the protective layer by patterning the organic photoresist material by a photo process using a mask.

12. The method according to claim 6, wherein the electrically connecting of the first and the second ends of the light emitting element to the first electrode and the second electrode, respectively, comprises:

forming a first contact electrode on the first end of the light emitting element and the first electrode; and forming a second contact electrode on the second end of the light emitting element and the second electrode.

\* \* \* \* \*